US010778150B2

(12) United States Patent
Lee et al.

(10) Patent No.: US 10,778,150 B2
(45) Date of Patent: *Sep. 15, 2020

(54) MULTI-INPUT SIGNAL AMPLIFIER WITH TAILORED AMPLIFIER ARCHITECTURES

(71) Applicant: SKYWORKS SOLUTIONS, INC., Woburn, MA (US)

(72) Inventors: Junhyung Lee, Irvine, CA (US); Johannes Jacobus Emile Maria Hageraats, Kamuela, HI (US); Joshua Haeseok Cho, Irvine, CA (US); Aravind Kumar Padyana, Costa Mesa, CA (US); Bipul Agarwal, Irvine, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/546,261

(22) Filed: Aug. 20, 2019

(65) Prior Publication Data

US 2020/0052652 A1 Feb. 13, 2020

Related U.S. Application Data

(63) Continuation of application No. 15/849,434, filed on Dec. 20, 2017, now Pat. No. 10,389,305.

(Continued)

(51) Int. Cl.
*H03F 3/72* (2006.01)
*H03F 1/02* (2006.01)
*H03F 3/19* (2006.01)
*H03F 1/56* (2006.01)
*H03G 3/30* (2006.01)
(Continued)

(52) U.S. Cl.
CPC .......... *H03F 1/0205* (2013.01); *H03F 1/223* (2013.01); *H03F 1/3205* (2013.01); *H03F 1/56* (2013.01); *H03F 1/565* (2013.01); *H03F 3/19* (2013.01); *H03F 3/193* (2013.01); *H03F 3/72* (2013.01); *H03G 1/0029* (2013.01); *H03G 1/0088* (2013.01); *H03G 3/3036* (2013.01); *H03G 5/28* (2013.01); *H03F 2200/222* (2013.01); *H03F 2200/387* (2013.01); *H03F 2200/451* (2013.01); *H04B 1/3827* (2013.01)

(58) Field of Classification Search
CPC ............ H03F 3/68; H03F 3/72; H03G 1/0088
USPC ........................................ 330/51, 124 R, 126
See application file for complete search history.

(56) References Cited

U.S. PATENT DOCUMENTS 10,389,305 B2 * 8/2019 Lee .......................... H03F 1/565

* cited by examiner

*Primary Examiner* — Steven J Mottola
(74) *Attorney, Agent, or Firm* — Chang & Hale LLP

(57) ABSTRACT

Disclosed herein are signal amplifiers having a plurality of amplifier cores. Individual amplifier cores can be designed for particular gain modes to enhance particular advantages while reducing other disadvantages. The signal amplifier can then switch between amplifier cores when switching gain modes to achieve desired performance characteristics (e.g., improving noise figure or linearity). Examples of signal amplifiers disclosed herein include amplifier architectures with a high gain amplifier core that reduces the noise figure and a linearity boost amplifier core that increases linearity (e.g., for lower gain modes). The disclosed signal amplifiers have a first active core with amplification chains for each of a plurality of inputs and a second active core with a single amplification chain to amplify signals received at the plurality of inputs.

20 Claims, 22 Drawing Sheets

Related U.S. Application Data

(60) Provisional application No. 62/437,052, filed on Dec. 20, 2016.

(51) Int. Cl.
*H03F 1/22* (2006.01)
*H03F 1/32* (2006.01)
*H03F 3/193* (2006.01)
*H03G 1/00* (2006.01)
*H03G 5/28* (2006.01)
*H04B 1/3827* (2015.01)

MULTI-INPUT SIGNAL AMPLIFIER WITH TAILORED AMPLIFIER ARCHITECTURES

CROSS-REFERENCE TO RELATED APPLICATIONS

This application is a continuation of U.S. application Ser. No. 15/849,434 filed Dec. 20, 2017 and entitled "MULTI-GAIN SIGNAL AMPLIFIER WITH SWITCHABLE AMPLIFIER ARCHITECTURES," which claims priority to U.S. Provisional Application No. 62/437,052 filed Dec. 20, 2016 and entitled "MULTI-GAIN SIGNAL AMPLIFIER WITH SWITCHABLE AMPLIFIER ARCHITECTURES," each of which is expressly incorporated by reference herein in its entirety for all purposes.

BACKGROUND

Field

The present disclosure relates to amplifiers for wireless communication applications.

Description of Related Art

Wireless communication devices typically include components in a front-end module that are configured to amplify received radio-frequency (RF) signals. The front-end module can include a plurality of gain modes to provide different levels of amplification.

SUMMARY

According to a number of implementations, the present disclosure relates to a variable-gain signal amplifier configured to provide a plurality of gain modes. The amplifier includes an input node configured to receive an input signal and an output node configured to provide an amplified output signal. The amplifier also includes a first active core configured to receive the input signal and to generate the amplified output signal for the output node and a second active core configured to receive the input signal and to generate the amplified output signal for the output node. The amplifier also includes a gain mode selector configured to direct the input signal to the first active core in a first gain mode and to direct the input signal to the second active core in a second gain mode different from the first gain mode.

In some embodiments, the input signal comprises a radio frequency signal. In some embodiments, the amplifier further includes a switchable reference bias circuit configured to provide a first reference bias current to the first active core in the first gain mode and a second reference bias current to the second active core in the second gain mode. In some embodiments, the gain mode selector is configured to selectively provide a bypass path that bypasses the first active core and the second active core and an amplification path that passes through either the first active core or the second active core.

In some embodiments, the amplifier further includes a degeneration switching block coupled to the first active core and to the second active core, the degeneration switching block configured to provide tailored impedances to the first active core and to the second active core. In further embodiments, the tailored impedances are configured to provide improved linearity in the amplified output signal relative to a variable gain stage that is not coupled to the degeneration switching block with the tailored impedances. In further embodiments, the degeneration switching block is configured to provide a first tailored impedance for the first gain mode and a second tailored impedance for the second gain mode. In yet further embodiments, the first tailored impedance is greater than the second tailored impedance and the first gain level is less than the second gain level.

In some embodiments, the amplifier further includes a control circuit configured to generate an amplification control signal to control the gain mode selector. In some embodiments, the first active core is configured to have a lower noise figure than the second active core. In further embodiments, the second active core is configured to have a higher linearity than the first active core. In yet further embodiments, the first gain mode is higher than the second gain mode.

In some embodiments, the amplifier further includes a plurality of input nodes. In further embodiments, the amplifier is configured to receive a plurality of input signals at the plurality of input nodes, individual received signals having frequencies within different signal frequency bands. In yet further embodiments, the amplifier is configured to amplify signals received at individual input ports independent of amplification of other received signals.

In some embodiments, the amplifier further includes a bypass block coupled to the input node and configured to be activated in a low gain mode to provide a bypass path that does not include the first active core and the second active core. In some embodiments, each of the first active core and the second active core include a cascode buffer coupled to an output of a gain stage.

According to a number of implementations, the present disclosure relates to a front-end module that includes a packaging substrate and a variable gain signal amplifier implemented on the packaging substrate. The variable gain signal amplifier includes a first active core configured to receive an input signal and to generate an amplified output signal, a second active core configured to receive the input signal and to generate the amplified output signal, a gain mode selector configured to direct the input signal to the first active core in a first gain mode and to direct the input signal to the second active core in a second gain mode. The front-end module also includes a controller implemented to control the variable gain signal amplifier to provide a plurality of gain modes including the first gain mode and the second gain mode.

In some embodiments, the variable gain signal amplifier further includes a degeneration switching block configured to provide tailored impedances to the first active core and to the second active core. In some embodiments, the gain signal amplifier further includes a switchable reference bias circuit configured to provide independent bias currents to the first active core and to the second active core. In some embodiments, the first active core is configured to have a lower noise figure than the second active core and the second active core is configured to have a higher linearity than the first active core.

According to a number of implementations, the present disclosure relates to a wireless device that includes an antenna, a filter assembly coupled to the antenna to receive signals and to direct frequency bands along select paths, and a variable gain signal amplifier. The variable gain signal amplifier includes a first active core configured to receive an input signal and to generate an amplified output signal, a second active core configured to receive the input signal and to generate the amplified output signal, and a gain mode selector configured to direct the input signal to the first active core in a first gain mode and to direct the input signal to the second active core in a second gain mode. The wireless device also includes a controller implemented to control the variable gain signal amplifier to provide a plurality of gain modes.

In some embodiments, the device further includes a degeneration switching block configured to provide tailored impedances to the first active core and to the second active core. In some embodiments, the gain signal amplifier further includes a switchable reference bias circuit configured to provide independent bias currents to the first active core and to the second active core. In some embodiments, the first active core is configured to have a lower noise figure than the second active core and the second active core is configured to have a higher linearity than the first active core.

For purposes of summarizing the disclosure, certain aspects, advantages and novel features have been described herein. It is to be understood that not necessarily all such advantages may be achieved in accordance with any particular embodiment. Thus, the disclosed embodiments may be carried out in a manner that achieves or optimizes one advantage or group of advantages as taught herein without necessarily achieving other advantages as may be taught or suggested herein.

DETAILED DESCRIPTION OF SOME EMBODIMENTS

Figure 1:
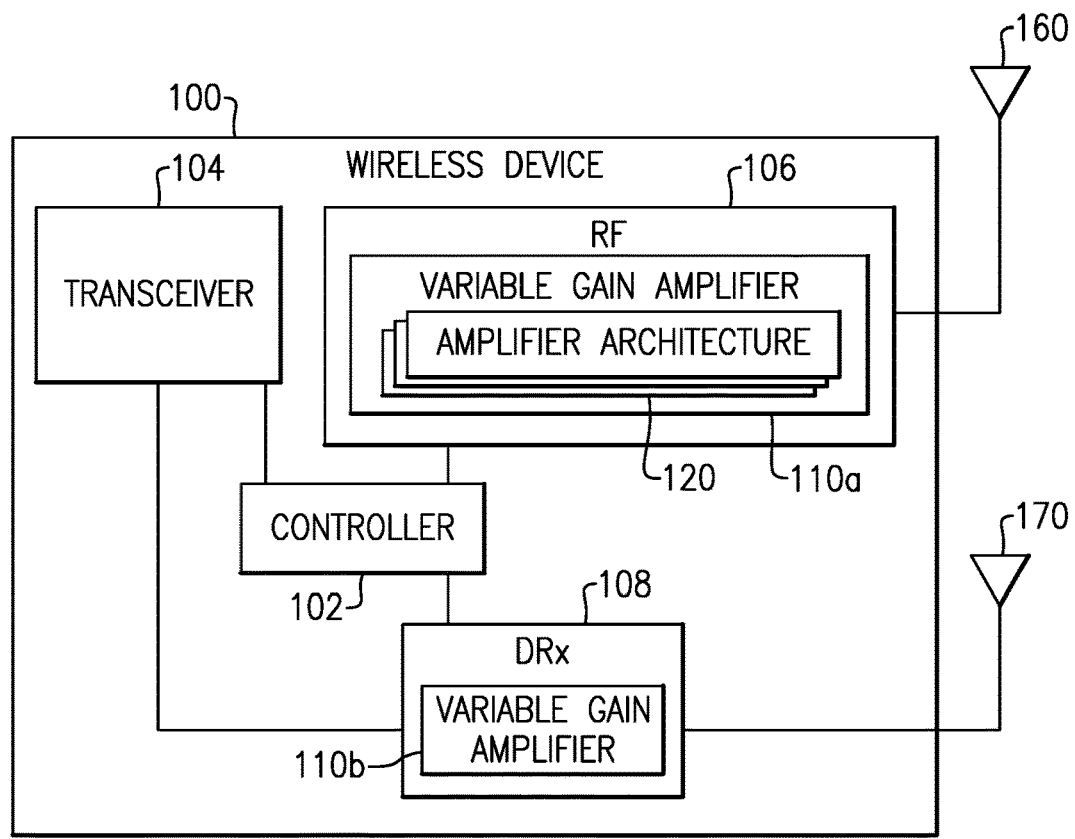
FIG. 1 illustrates an example wireless device having a primary antenna and a diversity antenna with signal amplifiers having a plurality of switchable amplifier cores.

The headings provided herein, if any, are for convenience only and do not necessarily affect the scope or meaning of the claimed invention.

Overview

Signal amplifiers in wireless devices, such as low noise amplifiers (LNAs), can be designed to amplify signals while providing desired characteristics, such as a targeted noise figure (NF) or targeted linearity. However, where a wireless device is designed to provide a plurality of gain modes, the signal amplifiers may suffer from reduced performance in one or more of the gain modes to achieve desired characteristics across the plurality of gain modes. Accordingly, disclosed herein are signal amplifiers that include a plurality of switchable amplifier architectures so that particular gain modes can use dedicated amplifier architectures to provide desired characteristics for those gain modes, such as low noise figure or high linearity.

Rather than providing a single amplifier core or architecture for all gain modes, the disclosed signal amplifiers provide a plurality of amplifier cores allowing individual amplifier cores to be designed for particular gain modes to achieve desired characteristics or to enhance particular advantages while reducing other disadvantages. For example, an amplifier architecture for high gain modes can be designed with a focus on achieving a targeted noise figure. As another example, an amplifier architecture for low gain modes can be designed with a focus on achieving a targeted linearity. The signal amplifier can then switch between using the high gain mode amplifier core (or the low NF core) for high gain modes, and the low gain amplifier core (or the high linearity core) for low gain modes. In certain implementations, the amplifier core designed to achieve high linearity can include a switchable degeneration block to further improve signal linearity.

One advantage of the disclosed amplifiers with switchable amplifier cores is that such a configuration allows for gain modes to be selectively directed to targeted amplifier architectures to achieve desired characteristics. This may change during operation of the wireless device so that, while operating in a particular gain mode, signals can be directed to a first active core during a first time period to achieve a particular set of advantages, and, while operating in the same gain mode, signals can be directed to a second active core during a second time period to achieve a different (possibly overlapping) set of advantages.

In some embodiments, the amplifiers disclosed herein can also be configured to receive multiple inputs and route the signals to appropriate amplifier architectures. In some embodiments, the signal amplifiers disclosed herein can perform multi-input processing without using a switch between inputs. In some embodiments, the amplifiers disclosed herein can be configured to achieve a desired or targeted bias current matching by using a switchable reference bias core. In some embodiments, the signal amplifiers disclosed herein can improve gain mode performance through the use of individual input matching per active core.

FIG. 1 illustrates an example wireless device 100 having a primary antenna 160 and a diversity antenna 170. The wireless device 100 includes an RF module 106 and a transceiver 104 that may be controlled by a controller 102. The transceiver 104 is configured to convert between analog signals (e.g., radio-frequency (RF) signals) and digital data signals. To that end, the transceiver 104 may include a digital-to-analog converter, an analog-to-digital converter, a local oscillator for modulating or demodulating a baseband analog signal to or from a carrier frequency, a baseband processor that converts between digital samples and data bits (e.g., voice or other types of data), or other components.

The RF module 106 is coupled between the primary antenna 160 and the transceiver 104. Because the RF module 106 may be physically close to the primary antenna 160 to reduce attenuation due to cable loss, the RF module 106 may be referred to as a front-end module (FEM). The RF module 106 may perform processing on an analog signal received from the primary antenna 160 for the transceiver 104 or received from the transceiver 104 for transmission via the primary antenna 160. To that end, the RF module 106 may include filters, power amplifiers, low noise amplifiers, band select switches, attenuators, matching circuits, and other components.

When a signal is transmitted to the wireless device 100, the signal may be received at both the primary antenna 160 and the diversity antenna 170. The primary antenna 160 and diversity antenna 170 may be physically spaced apart such that the signal at the primary antenna 160 and diversity antenna 170 is received with different characteristics. For example, in one embodiment, the primary antenna 160 and the diversity antenna 170 may receive the signal with different attenuation, noise, frequency response, and/or phase shift. The transceiver 104 may use both of the signals with different characteristics to determine data bits corresponding to the signal. In some implementations, the transceiver 104 selects from between the primary antenna 160 and the diversity antenna 170 based on the characteristics, such as selecting the antenna with the highest signal-to-noise ratio. In some implementations, the transceiver 104 combines the signals from the primary antenna 160 and the diversity antenna 170 to increase the signal-to-noise ratio of the combined signal. In some implementations, the transceiver 104 processes the signals to perform multiple-input/multiple-output (MiMo) communication.

In some embodiments, the diversity antenna 170 is configured to receive signals within multiple cellular frequency bands and/or wireless local area network (WLAN) frequency bands. In such embodiments, the wireless device 100 can include a multiplexer, switching network, and/or filter assembly coupled to the diversity antenna 170 that is configured to separate the diversity signal into different frequency ranges. For example, the multiplexer can be configured to include a low pass filter that passes a frequency range that includes low band cellular frequencies, a bandpass filter that passes a frequency range that includes low band WLAN signals and mid-band and high-band cellular signals, and a high pass filter that passes a frequency range that includes high-band WLAN signals. This example is merely for illustrative purpose. As another example, the multiplexer can have a variety of different configurations such as a diplexer that provides the functionality of a high pass filter and a low pass filter.

Because the diversity antenna 170 is physically spaced apart from the primary antenna 160, the diversity antenna 170 can be coupled to the transceiver 104 by a transmission line, such as a cable or a printed circuit board (PCB) trace. In some implementations, the transmission line is lossy and attenuates the signal received at the diversity antenna 170 before it reaches the transceiver 104. Thus, in some implementations, gain is applied to the signal received at the diversity antenna 170. The gain (and other analog processing, such as filtering) may be applied by the diversity receiver module 108. Because such a diversity receiver module 108 may be located physically close to the diversity antenna 170, it may be referred to a diversity receiver front-end module.

The RF module 106 and the diversity receiver module 108 include respective variable gain amplifiers 110a, 110b configured to provide a plurality of gain modes to amplify signals from the primary antenna 160 and the diversity antenna 170, respectively. The variable gain amplifiers 110a, 110b can include a plurality of amplifier architectures 120. Individual amplifier architectures 120 can be activated by the variable gain amplifier 110a, 110b based at least in part on an operating gain mode. The activated amplifier architecture can be designed to provide targeted or desired characteristics for the particular gain mode(s) directed to the architecture. In this way, desired characteristics can be enhanced for individual gain modes. Signals received at the variable gain amplifiers 110a, 110b can be amplified using a particular amplifier architecture selected by the variable gain amplifier 110a, 110b, or the signals can be allowed to bypass the amplifier architectures 120, as described in greater detail herein. The selected amplifier architecture 120, the bypass path, and/or the gain mode of the variable gain amplifier 110a, 110b can be controlled by the controller 102. The variable gain amplifier 110a, 110b can receive multiple input signals and output a single signal or a plurality of output signals.

Advantageously, the architecture of the variable gain amplifier 110a, 110b can provide for multi-input processing without the use of a switch. The variable gain amplifier 110a, 110b can advantageously achieve targeted or improved linearity by using a dedicated amplifier architecture with tailored electrical properties. Similarly, the variable gain amplifier 110a, 110b can advantageously achieve targeted or improved NF by using a dedicated amplifier architecture with tailored electrical properties. The variable gain amplifier 110a, 110b can provide targeted or improved input to output isolation through the use of a shunt switch in a bypass path and/or in one or more of the amplifier architectures 120.

The controller 102 can be configured to generate and/or send control signals to other components of the wireless device 100. In some embodiments, the controller 102 provides signals based at least in part on specifications provided by the mobile industry processor interface alliance (MIPI® Alliance). The controller 102 can be configured to receive signals from other components of the wireless device 100 to process to determine control signals to receive to other components. In some embodiments, the controller 102 can be configured to analyze signals or data to determine control signals to send to other components of the wireless device 100. The controller 102 can be configured to generate control signals based on gain modes provided by the wireless device 100. For example, the controller 102 can send control signals to the variable gain amplifiers 110a, 110b to control the gain mode. Similarly, the controller 102 can be configured to generate control signals to select amplifier architectures 120 to activate for particular gain modes. The controller 102 can be configured to generate control signals to control the variable gain amplifier 110a, 110b to provide a bypass path.

In some implementations, the controller 102 generates amplifier control signal(s) based on a quality of service metric of an input signal received at the input. In some implementations, the controller 102 generates the amplifier control signal(s) based on a signal received from a communications controller, which may, in turn, be based on a quality of service (QoS) metric of the received signal. The QoS metric of the received signal may be based, at least in part, on the diversity signal received on the diversity antenna 170 (e.g., an input signal received at the input). The QoS metric of the received signal may be further based on a signal received on a primary antenna 160. In some implementations, the controller 102 generates the amplifier control signal(s) based on a QoS metric of the diversity signal without receiving a signal from the communications controller. In some implementations, the QoS metric includes a signal strength. As another example, the QoS metric may include a bit error rate, a data throughput, a transmission delay, or any other QoS metric. In some implementations, the controller 102 controls the gain (and/or current) of the amplifiers in the variable gain amplifiers 110a, 110b. In some implementations, the controller 102 controls the gain of other components of the wireless device 100 based at least in part on an amplifier control signal.

The variable gain amplifiers 110a, 110b may include a step-variable gain amplifier configured to amplify received signals with a gain of one of a plurality of configured amounts indicated by an amplifier control signal. In some implementations, the variable gain amplifiers 110a, 110b may include a continuously-variable gain amplifier configured to amplify received signals with a gain proportional to or dictated by the amplifier control signal. In some implementations, the variable gain amplifiers 110a, 110b may include a step-variable current amplifier configured to amplify received signals by drawing a current of one of plurality of configured amounts indicated by the amplifier control signal. In some implementations, the variable gain amplifiers 110a, 110b may include a continuously-variable current amplifier configured to amplify received signals by drawing a current proportional to the amplifier control signal.

Figure 2:
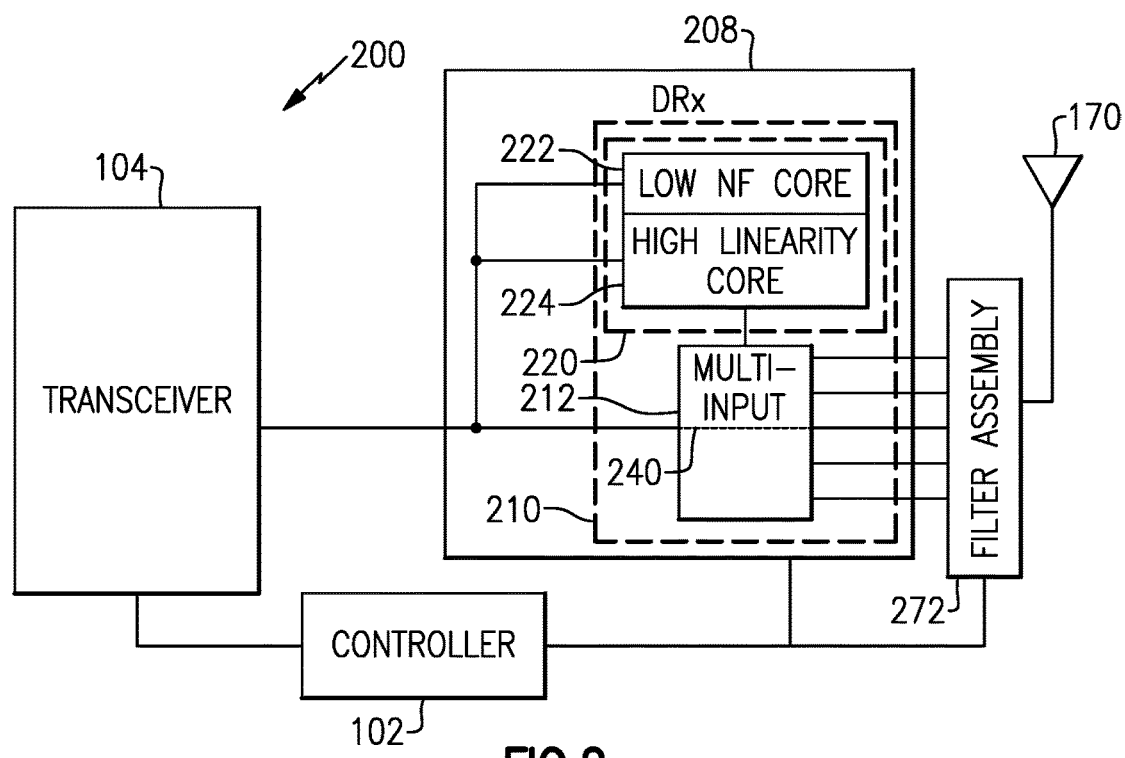
FIG. 2 illustrates an example diversity receiver (DRx) configuration including a DRx front-end module (FEM) that has a signal amplifier with a high linearity core and a low noise figure core.

FIG. 2 illustrates an example diversity receiver (DRx) configuration 200 including a DRx front-end module (FEM) 208. It is to be understood that the features of the DRx FEM 208 can be implemented in any front-end module described herein, such as the RF module 106 described herein with reference to FIG. 1. The DRx configuration 200 includes a diversity antenna 170 that is configured to receive a diversity signal and provide the diversity signal to the DRx FEM 208 through a filter assembly 272. The filter assembly 272 can include a multiplexer, for example, that is configured to selectively direct signals within targeted frequency ranges along respective paths to an amplifier 210 having a multi-input stage 212 that is coupled to amplifier architectures 220 that include a low NF core 222 and a high linearity core 224. The signals can be radio frequency (RF) signals that include, for example and without limitation, cellular signals (e.g., low-, mid-, high- and/or ultra-high-band cellular frequencies), WLAN signals, BLUETOOTH® signals, GPS signals, and the like.

The DRx FEM 208 is configured to perform processing on the diversity signals received from the filter assembly 272. For example, the DRx FEM 208 may be configured to filter the diversity signals to one or more active frequency bands that can include cellular and/or WLAN frequency bands. The controller 102 can be configured to control the DRx FEM 208 to selectively direct signals to targeted filters to accomplish the filtering. As another example, the DRx FEM 208 may be configured to amplify one or more of the filtered signals using a particular active core 222, 224 of the amplifier architectures 220. To that end, the DRx FEM 208 may include filters, low-noise amplifiers, band select switches, matching circuits, and other components. The controller 102 can be configured to interact with components in the DRx FEM 208 to intelligently select paths for the signals through the DRx FEM 208.

The DRx FEM 208 transmits at least a portion of the processed diversity signals to the transceiver 104. The transceiver 104 may be controlled by the controller 102. In some implementations, the controller 102 may be implemented within the transceiver 104.

The DRx FEM 208 can be configured to provide a plurality of gain modes. For the plurality of gain modes, different amplifier architectures 220 can be selected to amplify input signals. In one or more gain modes, the signals can be routed to a low NF core 222 to amplify signals with an emphasis on achieving a low NF, such as for high gain modes. In one or more gain modes, the signals can be routed to a high linearity core 224 to amplify signals with an emphasis on achieving a targeted linearity, such as for low or medium gain modes. It is to be understood that different amplifier architectures may also be implemented that provide targeted performance characteristics including, for example and without limitation, NF, linearity, gain, bandwidth, power consumption, stability, input or output matching, reverse isolation, or any combination of these. Such amplifier architectures may be implemented in place of or in addition to the amplifier architectures described herein.

In some embodiments, the amplifier architectures 220 include selectable impedances coupled to the amplification stage to provide improved impedance matching, linearity, and/or IIP3. In some embodiments, the DRx configuration 200 is configured to bypass amplification when operating in a low gain mode and to amplify signals with a particular amplifier architecture 220 when operating in other gain modes. This can advantageously allow the DRx configuration 200 to improve linearity and/or NF in particular gain modes.

In some embodiments, the amplifier 210 is configured to receive a plurality of input signals and to provide a single output signal. In certain embodiments, the amplifier 210 can be configured to receive a plurality of input signals and provide a corresponding plurality of output signals. The filter assembly 272 can be configured to direct signals corresponding to particular frequency bands along designated paths to the amplifier 210. The amplifier 210 can provide different gain modes for the received signals. The amplifier architectures 220 can provide different amplification characteristics so that different gain modes can be amplified using particular amplifier architectures to achieve desired or targeted amplification performance. The particular amplifier architecture that is selected, such as the low NF core 222 or the high linearity core 224, can be based on the gain mode of the amplifier 210. In certain implementations, the amplifier 210 can operate in a bypass configuration such that the signal passes through a bypass path 240 and in an amplification configuration such that the signal passes through an amplification path that includes a selected amplifier architecture, such as low NF core 222 or high linearity core 224. This can advantageously allow the DRx FEM 208 to provide variable gain and/or a plurality of gain modes while reducing the negative impacts on linearity (e.g., IIP3 and/or noise factor (NF) relative to configurations that do not selectively provide amplifier architectures for particular gain modes. The amplifier 210 can include any suitable amplifier circuit configured to provide a desired or targeted amplification. In some embodiments, the amplifier 210 includes a low-noise amplifier (LNA) circuit configured to amplify signals from a plurality of frequency bands (e.g., cellular frequency bands and/or WLAN frequency bands) received at a plurality of inputs, or a multi-input LNA. However, it is to be understood that the embodiments described herein are not to be limited to implementations that utilize low-noise amplifiers but include implementations that use any of a variety of amplifiers.

The amplifier 210 can be configured to amplify signals based at least in part on a plurality of gain modes. For example, the amplifier 210 can be configured to provide a first amplification or gain for a first gain mode, a second amplification or gain for a second gain mode, and so on. The amplifier 210 can be controlled by the controller 102 to control the gain provided at the amplifier 210. For example, the controller 102 can provide a signal indicative of a desired or targeted gain to the amplifier 210 and the amplifier 210 can provide the targeted gain. The controller 102 may receive an indication of the targeted gain from another component in a wireless device, for example, and control the amplifier 210 based at least in part on that indication. Similarly, the amplifier architectures 220 can be activated based at least in part on a gain mode and/or targeted gain of the amplifier 210.

The controller 102 can be configured to control the DRx FEM 208 to selectively provide tailored gain performance. For example, the controller 102 and the DRx FEM 208 can control the amplifier architectures 220 to direct signals to a targeted amplifier core (e.g., low NF core 222 or high linearity core 224) based at least in part on a gain mode. As another example, the controller 102 and the DRx FEM 208 can control the amplifier 210 to provide a bypass path 240 based at least in part on a gain mode. As another example, the controller 102 and the DRx FEM 208 can use the amplifier 210 to provide a plurality of gain modes.

Example Architectures of Variable Gain Amplifiers

Front-end modules generally include amplifiers such as low-noise amplifiers (LNAs) to amplify received signals. In wireless devices that provide a variety of gain modes, it may be advantageous to selectively direct signals through amplifier cores that provide targeted performance characteristics, such as low NF and/or high linearity, to improve or optimize amplifier performance. Similarly, for at least one gain mode, it may be advantageous to bypass a gain stage to improve performance (e.g., linearity).

Accordingly, provided herein are variable gain amplifiers that selectively direct signals to particular amplifier architectures depending at least in part on a gain mode of the variable gain amplifier. This advantageously reduces or eliminates performance penalties in one or more gain modes. Similarly, this advantageously increases or optimizes performance characteristics in one or more gain modes. Furthermore, the amplifier architectures can be configured to improve NF and/or linearity of the amplification process in targeted gain modes. Similarly, the variable gain amplifier can be configured to provide a low-loss bypass mode in a low gain mode to improve signal quality.

Figure 3A:
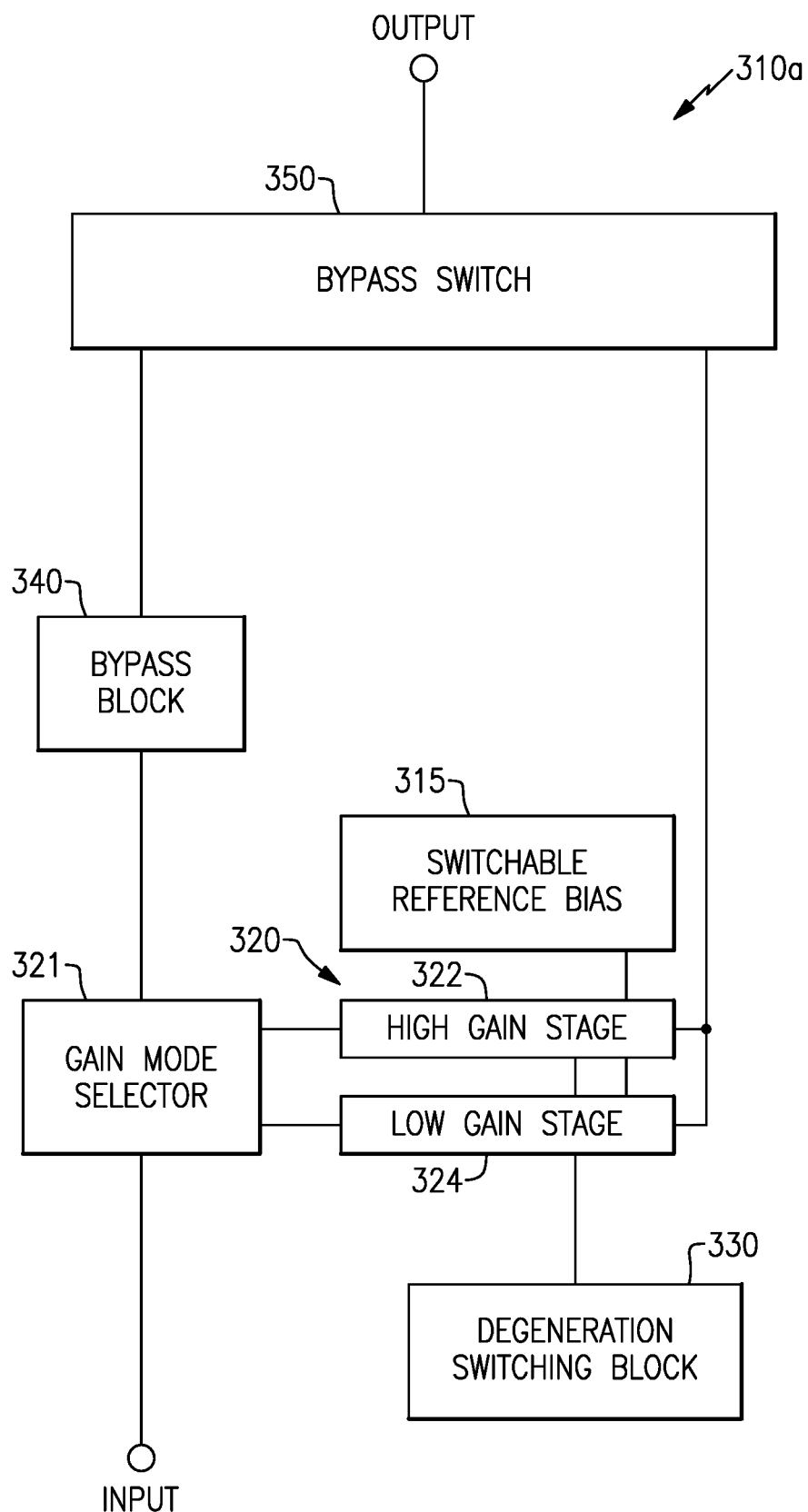
FIGS. 3A, 3B, 3C, 3D, 3E, and 3F illustrate various example variable gain amplifier configurations that include a switchable reference bias, a gain mode selector, a bypass block, one or more degeneration switching blocks, and a plurality of amplifier architectures configured to receive input signals and to selectively amplify the received signals with a selected amplifier architecture or to provide a bypass path through the bypass block.

FIG. 3A illustrates an example variable gain amplifier configuration 310a that includes a switchable reference bias 315, a gain mode selector 321, a bypass block 340, and a plurality of amplifier architectures 320 configured to receive input signals and to selectively amplify the received signals with a selected amplifier architecture 320 or to provide a bypass path through the bypass block 340. Each of the amplifier architectures 320 is coupled to a degeneration switching block 330 that is configured to selectively provide tailored impedances based at least in part on a gain mode of the variable gain amplifier configuration 310a. The gain mode selector 321 is configured to direct signals to a selected amplifier architecture 320 (e.g., a high gain stage 322 or a low gain stage 324) or to the bypass block 340 based at least in part on a gain mode of the amplifier configuration 310a. The gain mode selector 321 includes elements that can switch the signal path from the input to the targeted destination (e.g., a selected amplifier architecture 322 or 324 or the bypass block 340).

The amplifier architectures 320 include a high gain stage 322 and a low gain stage 324. Each of the high gain stage 322 and the low gain stage 324 can be configured to enhance or emphasize desired performance characteristics, where one or more of the enhanced characteristics can be shared between the gain stages 322, 324 or they can be configured to enhance different characteristics. In some implementations, enhancement of certain performance characteristics may degrade other performance characteristics. However, this may be beneficial where, in a particular gain mode, the enhanced characteristics positively affect amplifier performance more than the degraded characteristics negatively affect amplifier performance. For example, when operating in one or more high gain modes, the gain mode selector 321 can direct signals received from the input to the high gain stage 322. The high gain stage 322 can be configured to reduce NF relative to the low gain stage 324. In a high gain mode, smaller signals are typically received and may be more susceptible to degradation due to noise. Hence, it may be beneficial to tailor the amplifier so that it reduces the NF during amplification. Similarly, when operating in one or more low gain modes, the gain mode selector 321 can direct signals received from the input to the low gain stage 324. The low gain stage 324 can be configured to enhance or boost linearity relative to the high gain stage 322. In a low gain mode, signals are typically larger and less susceptible to noise. Hence, it may be more advantageous to tailor the amplifier so that it enhances linearity than to reduce noise. Accordingly, providing different amplifier architectures for different gain modes allows signals to be directed to advantageous amplifier architectures to achieve desired or targeted performance characteristics.

The switchable reference bias 315 can be configured to provide reference bias voltages to the amplifier architectures 320. The reference bias voltages can be configured to be tailored for a particular gain stage. For example, in one or more high gain modes, the switchable reference bias 315 can provide a first reference bias voltage to the high gain stage 322, and in one or more low gain modes, the switchable reference bias 315 can provide a second reference bias voltage to the low gain stage 324. In this way, the amplifier configuration 310a can be configured to achieve desired or targeted bias current matching.

The variable gain amplifier configuration 310a can be further configured to achieve targeted performance characteristics (e.g., relatively high linearity, impedance matching, etc.) through the use of the degeneration switching block 330. In certain implementations, the bypass block 340 includes a shunt switch that can provide high input to output isolation relative to configurations without such a switch. The variable gain amplifier configuration 310a can be configured to provide a low-loss direct bypass mode by directing signals from the input through the bypass block 340 and not through the amplifier architectures 320. The low-loss direct bypass mode can be implemented in a low gain mode, for example. In some embodiments, the variable gain amplifier configuration 310a can include a degeneration switching block 330 for each input to further isolate the inputs.

The degeneration switching block 330 is configured to provide impedance to the selected amplifier architecture 320. This can improve performance by providing power and/or noise matching with prior stages in the processing chain. The degeneration switching block 330 can be configured to improve performance (e.g., linearity and/or NF) of the amplifier architectures 320 by providing a feedback mechanism. In some embodiments, the degeneration switching block 330 is configured to provide a first impedance for a first gain mode and a second impedance for a second gain mode. The selected impedances provided by the degeneration switching block 330 can also be configured to improve linearity of the selected amplifier architecture 320. The variable gain amplifier configuration 310a can be configured to bypass the degeneration switching block 330 in a bypass mode. This can improve linearity performance by reducing or minimizing leakage current passing through the selected amplifier architecture 320.

The bypass block 340 is configured to receive signals from the gain mode selector 321 and to provide a path to the output that does not pass through the amplifier architectures 320 or the degeneration switching block 330. The bypass block 340 can include components that serve to isolate the input and output in one or more of the gain modes provided by the variable gain amplifier configuration 310a.

The bypass switch 350 is configured to selectively provide a path from the input through the bypass block 340 to the output or a path from the input through a selected amplifier architecture 320 to the output. The bypass switch 350 can include one or more switching elements to isolate and/or to select the desired path based at least in part on a gain mode of the variable gain amplifier configuration 310a.

In certain embodiments, the variable gain amplifier configuration 310a can be configured to provide a plurality of gain modes, e.g., gain modes G0, G1, . . . , GN with G0 being the highest gain and GN being a bypass mode. When operating in gain mode GN, the variable gain amplifier configuration 310a can be configured to direct signals from the input to the bypass block 340. When operating in gain modes G0 to GN–1, the variable gain amplifier configuration 310a can be configured to direct signals through a selected gain stage 322, 324 and to activate the degeneration switching block 330. The degeneration switching block 330 can be configured to provide different impedance levels for individual gain modes or for groups of gain modes. Even in these gain modes, the bypass block 340 may be at least partially activated by activating a shunt switch in the bypass block 340 to provide isolation between the inputs and the output.

The variable gain amplifier configuration 310a can be configured to activate the high gain stage 322 for one or more of the gain modes G0 to GN–2 and to activate the low gain stage 324 for one or more of the gain modes G1 to GN–1. In certain implementations, signals are directed to the high gain stage 322 in gain mode G0 and signals are directed to the low gain stage 324 in gain mode GN–1. For gain modes G1 to GN–2, signals may be directed to either the high gain stage 322 or to the low gain stage 324. In some embodiments, the amplifier configuration 310a can be dynamically configured to direct signals to either the high gain stage 322 or the low gain stage 324 regardless of the gain mode. In some embodiments, the amplifier configuration 310a can operate in a particular gain mode and can dynamically direct signals to the high gain stage 322 during a first time period and to the low gain stage 324 during a second time period.

The variable gain signal amplifier configuration 310a can be configured to achieve relatively low noise and high linearity (e.g., higher IIP3) relative to amplifiers with a single amplifier architecture or core. Similarly, the variable gain signal amplifier configuration 310a can achieve superior performance characteristics relative to amplifiers without multiple amplifier architectures 320, bypass block 340, and/or degeneration switching block 330. The variable gain signal amplifier configuration 310a can be configured to amplify radio frequency (RF) signals such as cellular signals, WLAN signals, BLUETOOTH® signals, GPS signals, and the like. The variable gain signal amplifier configuration 310a can be configured to provide broadband capabilities by receiving signals over a plurality of frequency bands at the multiple inputs and processing these signals. The variable gain signal amplifier configuration 310a can be configured to be controlled by a control circuit assembly, such as a controller (e.g., the controller 102 described herein with reference to FIGS. 1 and 2). The control circuit assembly can intelligently and selectively switch paths between amplifier architectures 320 and a bypass path and can selectively provide impedances with the degeneration switching block 330.

Figure 3B:
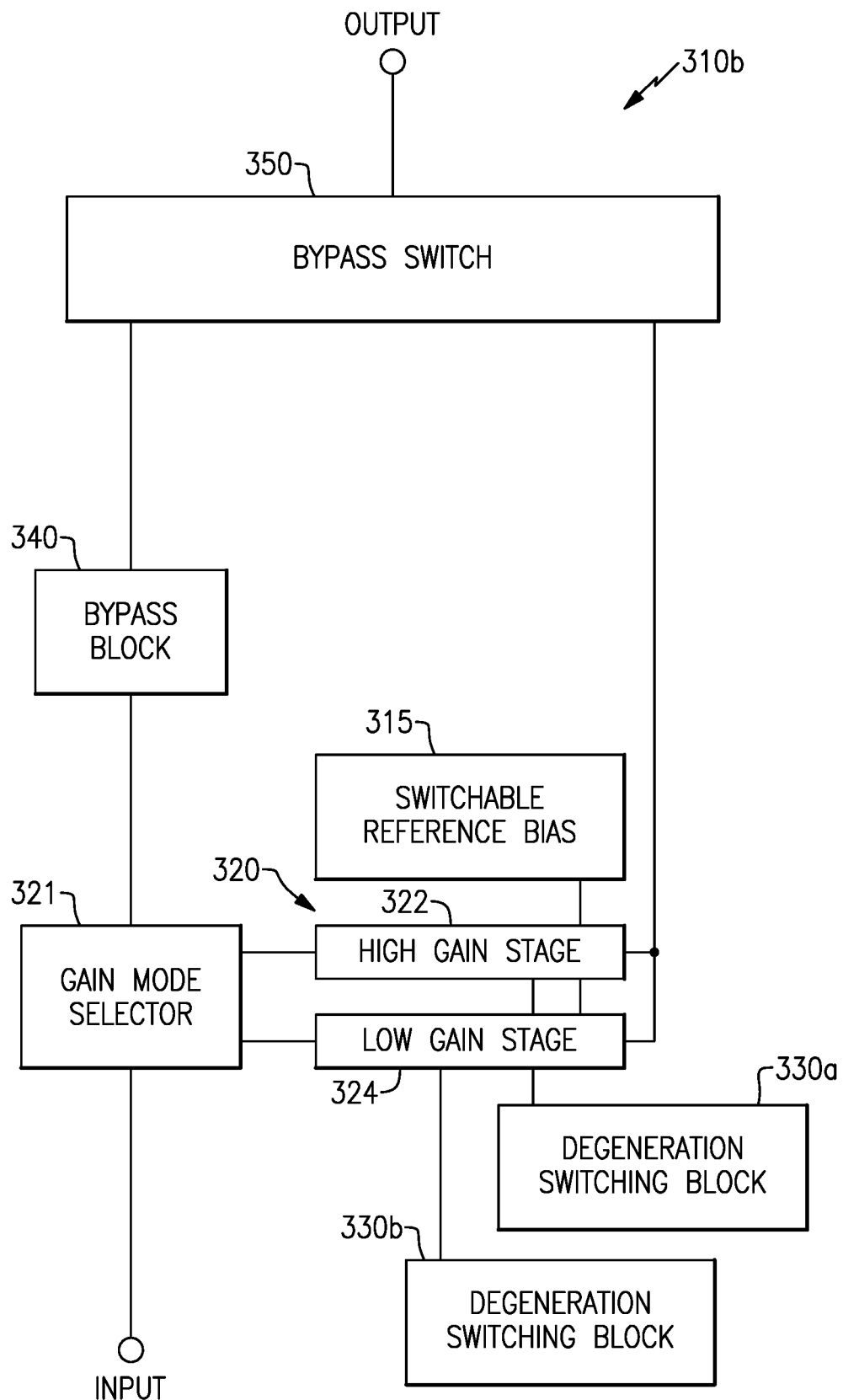

FIG. 3B illustrates another example variable gain amplifier configuration 310b that includes the same components as the variable gain amplifier configuration 310a of FIG. 3A, with an additional degeneration switching block 330b. Thus, the variable gain amplifier configuration 310b includes degeneration switching blocks 330a and 330b respectively operating with the high gain stage 322 and the low gain stage 324. In some implementations, each gain stage of the amplifier architectures 320 includes a degeneration switching block or a degeneration element (e.g., inductive degeneration).

Figure 3C:
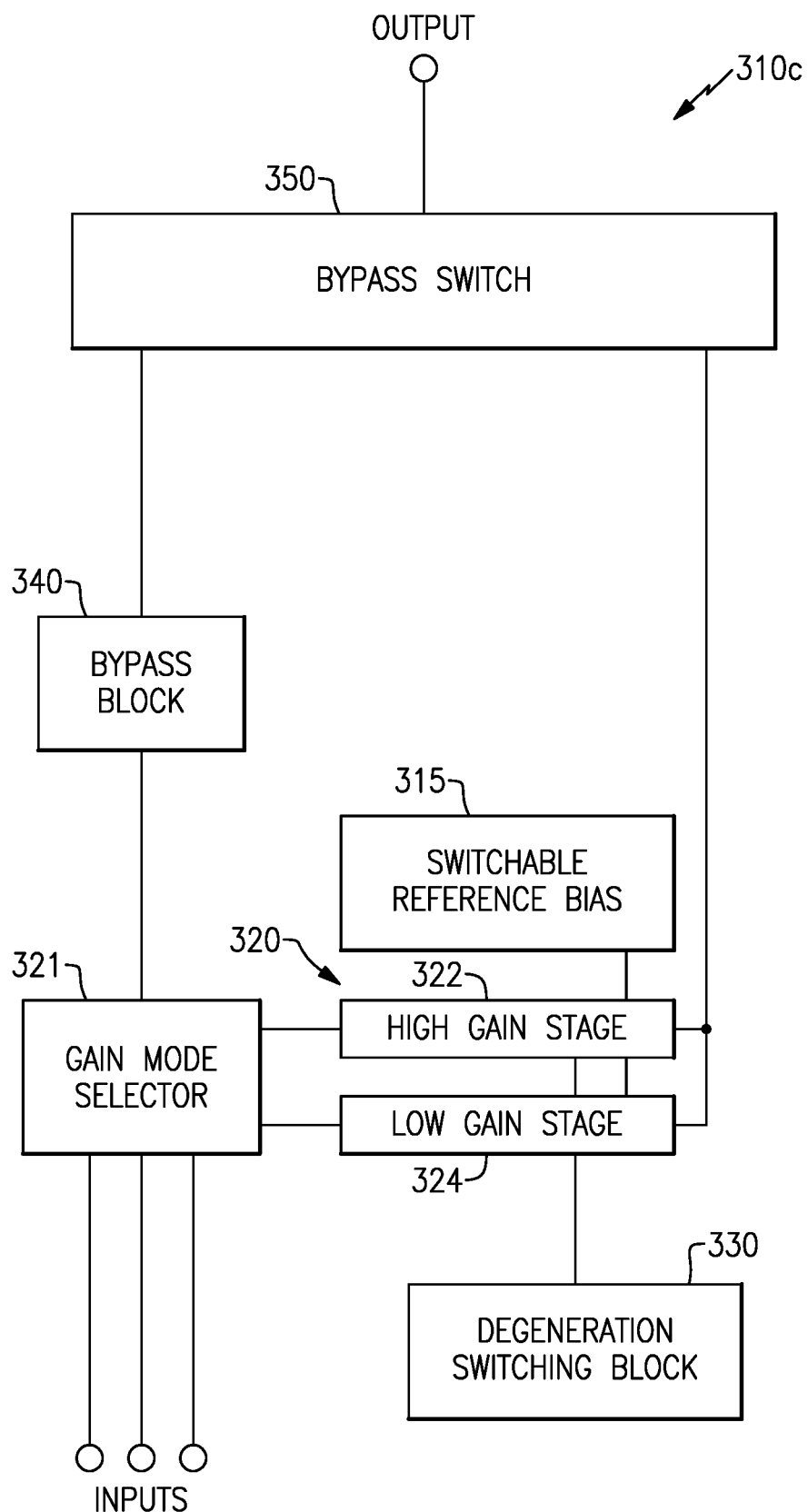

FIG. 3C illustrates another example variable gain amplifier configuration 310c that includes the same components as the variable gain amplifier configuration 310a of FIG. 3A, with multiple inputs, thereby providing a multi-input multi-gain amplifier with switchable active cores. In certain implementations, the amplifier configuration 310c is configured to receive multiple signals at distinct input ports, each distinct input port configured to receive signals at one or more particular cellular frequency bands. For example, a signal in a first band can be received at a first input port, a signal in a second band can be received at a second input port, and a signal in a third band can be received at a third input port. The variable gain amplifier configuration 310c can be configured to provide multi-input processing without the use of a switching network. The variable gain signal amplifier configuration 310c can be configured to independently process signals at the respective inputs.

It is to be understood that although three inputs are illustrated, the variable gain amplifier configuration 310c can include any suitable number of inputs. For example, and without limitation, the variable gain amplifier configuration 310c can include at least 2 inputs, at least 4 inputs, at least 8 inputs, at least 16 inputs, at least 32 inputs, at least 64 inputs, or at least any number of inputs in the described ranges. As another example and without limitation, the variable gain amplifier configuration 310c can include less than or equal to 64 inputs, less than or equal to 32 inputs, less than or equal to 16 inputs, less than or equal to 8, less than or equal to 4 inputs, or less than or equal to any number of inputs in the described ranges.

Figure 3D:
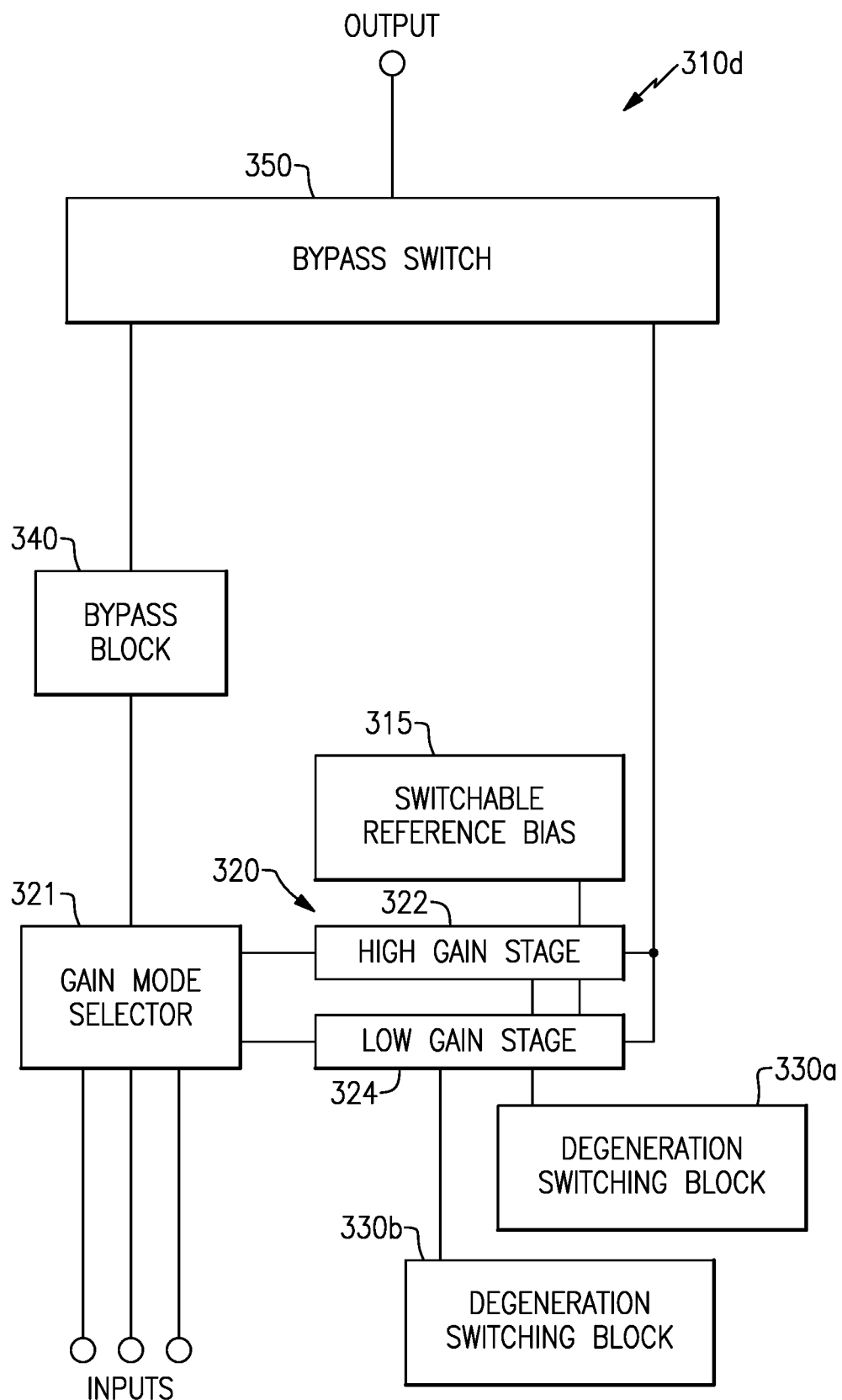

FIG. 3D illustrates another example variable gain amplifier configuration 310d that includes the same components as the variable gain amplifier configuration 310b of FIG. 3B, with multiple inputs, thereby providing a multi-input multi-gain amplifier with switchable active cores and degeneration switching blocks for individual gain stages. Thus, the variable gain amplifier configuration 310d includes degeneration switching blocks 330a and 330b respectively operating with the high gain stage 322 and the low gain stage 324. In some implementations, each gain stage of the amplifier architectures 320 includes a degeneration switching block or a degeneration element (e.g., inductive degeneration). In addition, certain implementations of the amplifier configuration 310d are configured to receive multiple signals at distinct input ports, each distinct input port configured to receive signals at one or more particular cellular frequency bands. The variable gain amplifier configuration 310d can be configured to provide multi-input processing without the use of a switching network. The variable gain signal amplifier configuration 310d can be configured to independently process signals at the respective inputs.

Figure 3E:
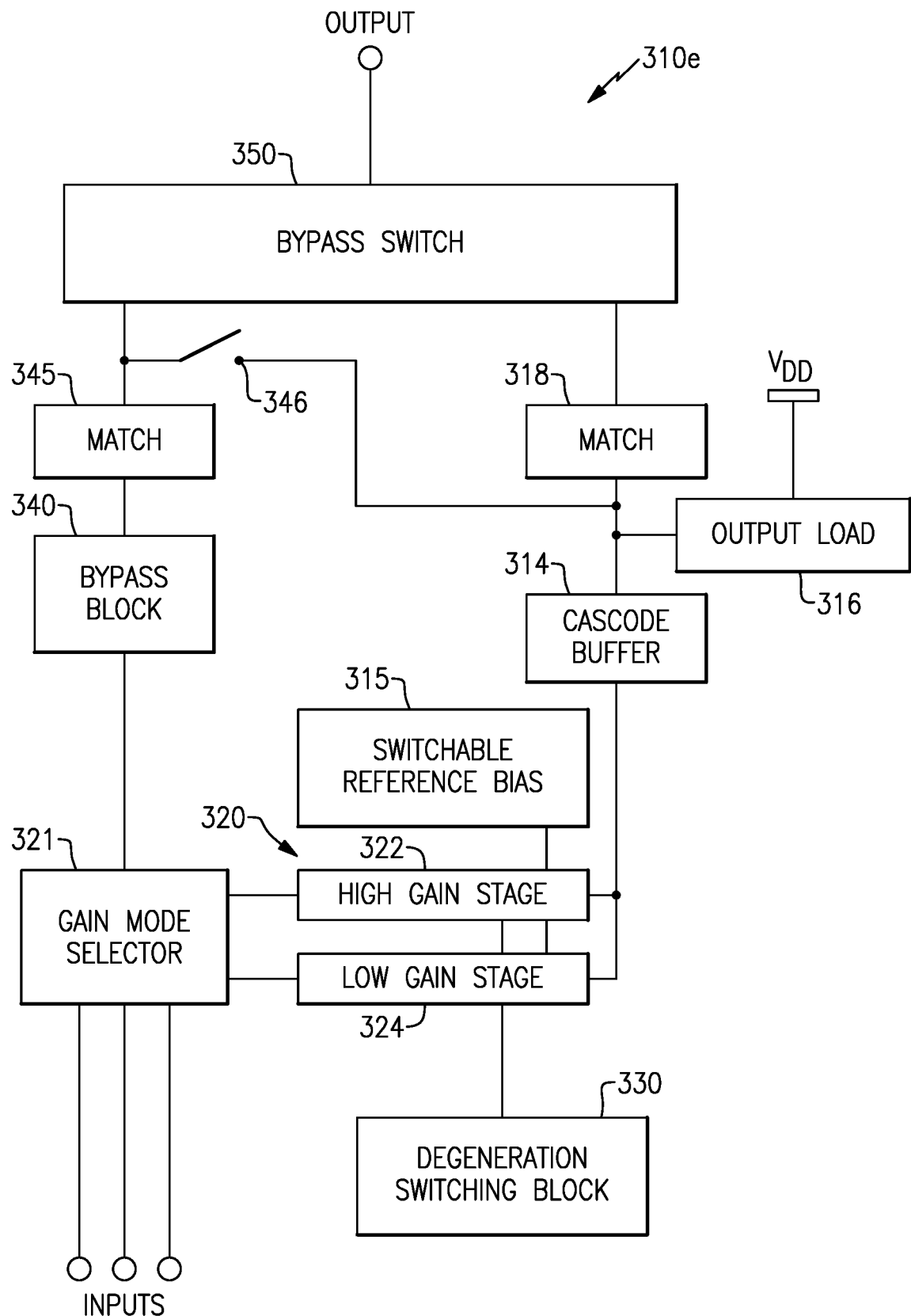

FIG. 3E illustrates another example variable gain amplifier configuration 310d that includes the same components as the variable gain amplifier configuration 310c of FIG. 3C, with additional components. For example, the variable gain amplifier configuration 310d includes matching networks 318 and 345. The output matching network 318 is configured to provide impedance matching for an output load 316 and the amplifier comprising the amplifier architectures 320 and a cascode buffer 314. The bypass matching network 345 similarly provides impedance matching for the bypass block 340. For the matching networks 318 and 345, any suitable combination of inductors and capacitors can be used to provide the targeted impedances.

The variable gain amplifier configuration 310d also includes the output load 316 and cascode buffer 314 as part of the amplification chain. The cascode buffer 314 can be configured to act as a current buffer. The cascode buffer 314 is configured to provide isolation between the amplifier architectures 320 and the output. The cascode buffer 314 can also be configured to improve the gain of the active cores 320 of the variable gain amplifier configuration 310d. The output load 316 is configured to provide a load to current to generate an output voltage swing. The output load 316 can be configured to be tuned or tunable for each band received at the inputs. The output load 316 can be configured to improve return loss and/or increase bandwidth by tailoring the resistance of the output load 316. The current through the output load 316 can be used to set the gain mode of the variable gain amplifier configuration 310d. For example, a lower current flowing through the output load 316 can be configured to correspond to a lower gain of the variable gain amplifier configuration 310d.

Figure 3F:
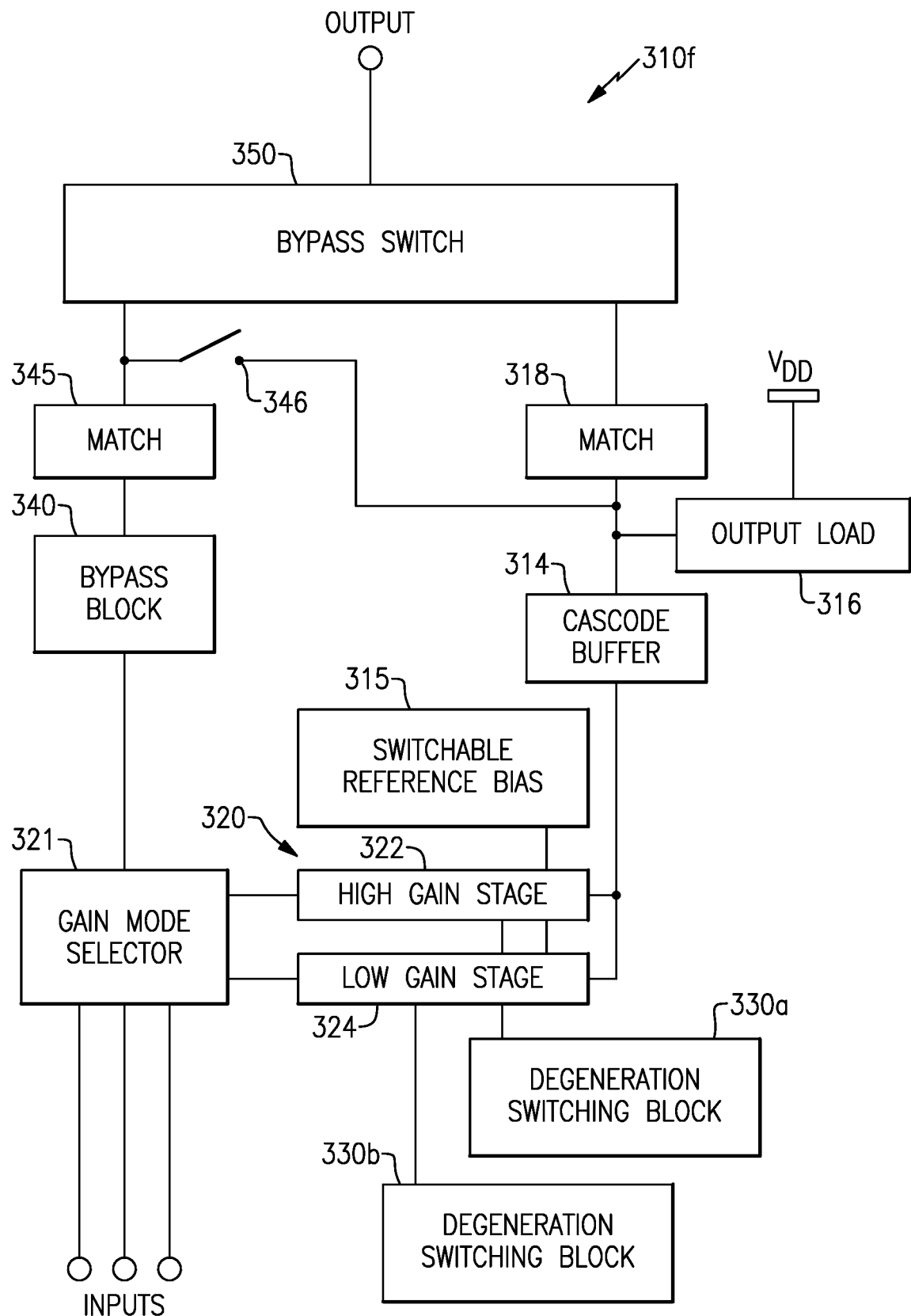

FIG. 3F illustrates another example variable gain amplifier configuration 310f that includes the same components as the variable gain amplifier configuration 310e of FIG. 3E, with an additional degeneration switching block 330b as in the variable gain amplifier configuration 310b or 310d of FIGS. 3B and 3D, respectively. Thus, the variable gain amplifier configuration 310b includes degeneration switching blocks 330a and 330b respectively operating with the high gain stage 322 and the low gain stage 324. In some implementations, each gain stage of the amplifier architectures 320 includes a degeneration switching block or a degeneration element (e.g., inductive degeneration).

Figure 4:
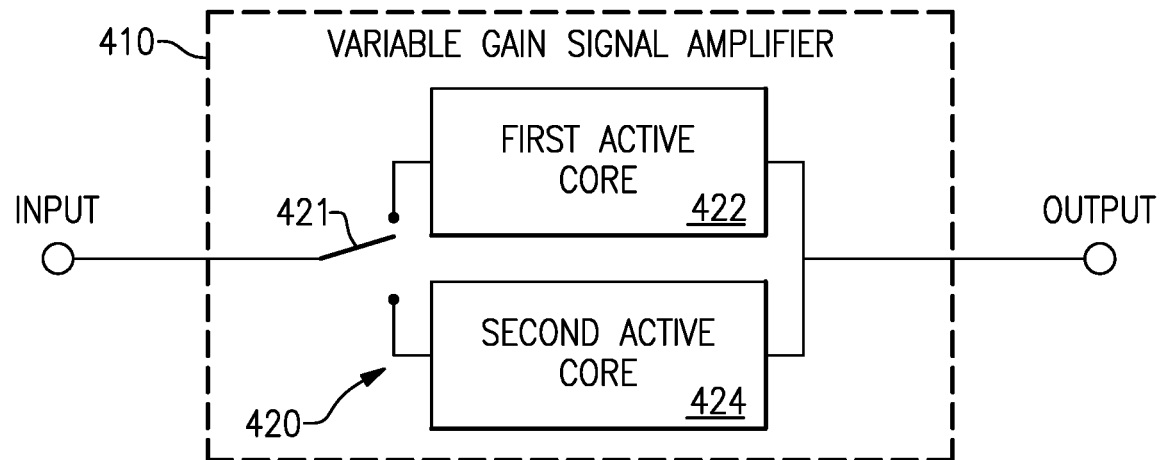
FIG. 4 illustrates a variable-gain signal amplifier that includes a plurality of active cores in a variable-gain stage configured to receive an input signal and to generate an amplified output signal.

FIG. 4 illustrates a variable-gain signal amplifier 410 that includes a plurality of active cores 422, 424 in a variable-gain stage 420 configured to receive an input signal and to generate an amplified output signal. The amplifier 410 can direct signals to the first active core 422 or to the second active core using a gain mode selector 421, represented as a switch. It should be understood, however, that any combination of electronic elements can be used as the gain mode selector 421 to selectively direct signals to a particular active core. The first active core 422 can be configured to amplify signals while providing enhanced performance characteristics, such as low NF. The first active core 422 can be used in one or more gain modes of the amplifier 410. The second active core 424 can be configured to amplify signals while providing different or overlapping enhanced performance characteristics relative to the first active core 422, such as high linearity.

The active cores 422, 424 can be operated independently of one another. The active cores 422, 424 advantageously allow individual cores to be tailored or optimized for one or more gain modes to improve overall performance of the amplifier 410 across gain modes. Such amplifiers 410 with independent active cores 422, 424 can advantageously allow for easy mapping of particular gain modes to one of the active cores. If it is desirable to achieve different performance characteristics for a particular gain mode, it is not necessary to redesign the amplifier 410 because an individual core can be modified without affecting all gain modes (e.g., gain modes mapped to other active cores). This allows for targeted tuning for particular gain modes. This also allows for dynamic and independent assignment of gain modes to active cores. This also allows particular active cores to be tailored or optimized to satisfy particular performance requirements. For example, in a high gain mode, reducing NF may be of particular interest, so an active core can be designed to reduce NF while other performance characteristics may be degraded. Similarly, in medium or low gain modes, linearity may be of particular interest, so an active core can be designed to enhance linearity while other performance characteristics may be degraded or gain may be decreased. As another example, the active core configured for use in medium or low gain modes can be a different size from an active core configured for use in a high gain mode. Accordingly, different active cores can be of different sizes, types, etc.

In some embodiments, the amplifier 410 can include 3 or more active cores, 4 or more active cores, or 5 or more active cores. In various embodiments, the amplifier 410 can include less than or equal to 10 active cores, less than or equal to 7 active cores, or less than or equal to 5 active cores. In a first gain mode, the amplifier 410 can direct signals through an amplification path that includes the first active core 422. In a second gain mode, the amplifier 410 can direct signals through an amplification path that includes the second active core 424. In some embodiments, the amplifier 410 can direct signals to the first active core 422 for a plurality of gain modes. In certain embodiments, the amplifier 410 can direct signals to the second active core 424 for a plurality of gain modes. In various embodiments, the first active core 422 provides higher gain than the second active core 424. In certain embodiments, the second active core 424 provides lower gain and higher linearity than the first active core 422.

Figure 5:
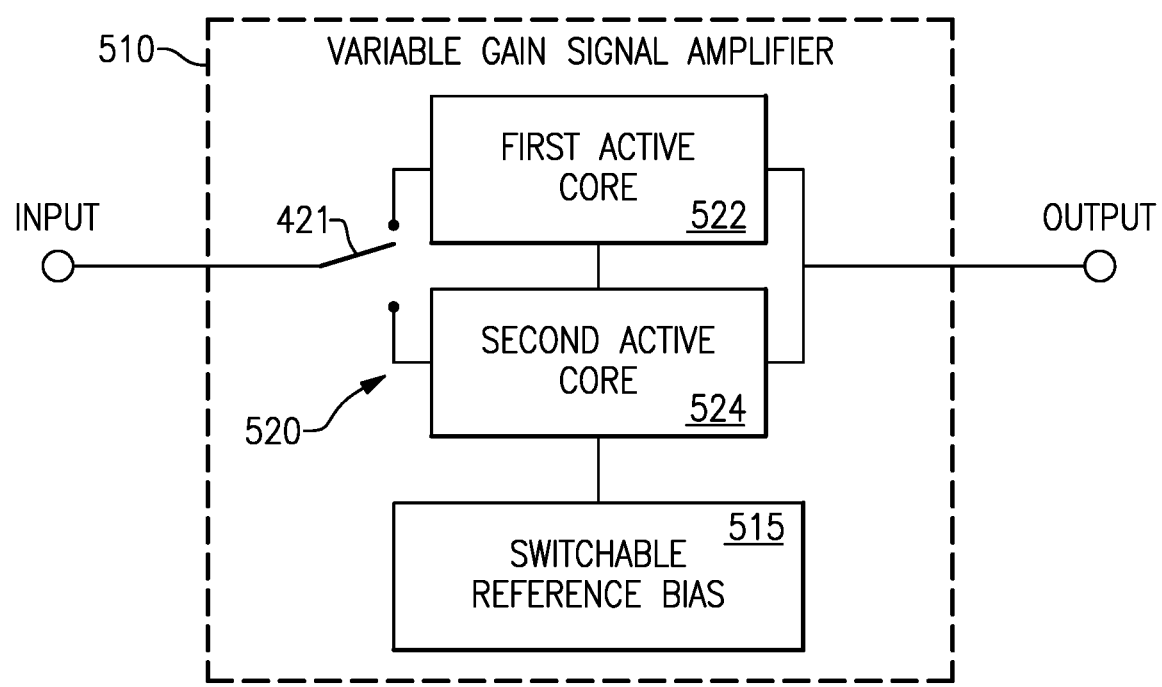
FIG. 5 illustrates a variable-gain signal amplifier that includes a switchable reference bias coupled to the active cores of the variable-gain stage.

FIG. 5 illustrates a variable-gain signal amplifier 510 that includes a switchable reference bias 515 coupled to the active cores 522, 524 of the variable-gain stage 520. The switchable reference bias 515 can selectively provide reference bias signals to the active core that has been selected based on the gain mode of the amplifier 510. The switchable reference bias 515 can be configured to provide current matching in the selected active core of the gain stage 520.

Figure 6:
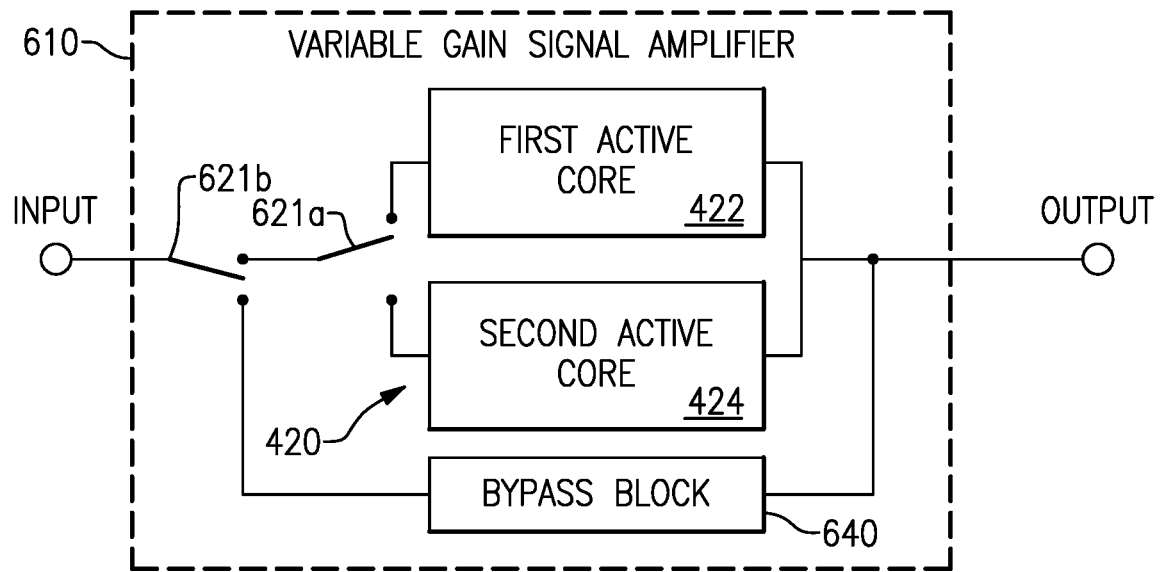
FIG. 6 illustrates a variable-gain signal amplifier that includes a bypass block that provides a bypass path in addition to the amplification path through one of the active cores of the variable-gain stage.

FIG. 6 illustrates a variable-gain signal amplifier 610 that includes a bypass block 640 that provides a bypass path in addition to the amplification path through one of the active cores 422, 424 of the variable-gain stage 420. The amplifier 610 has a gain mode selector that includes a bypass switch 621b and a core switch 621a. The bypass switch 621b directs signals to the bypass block 640 in a bypass mode. The bypass switch 621b directs signals to the core switch 621a in an amplification mode. The core switch 621a directs signals to a particular active core 422, 424 depending on the gain mode of the amplifier 610. In some embodiments, the gain mode selector includes a single-pole, multi-throw switch configuration to direct signals to the appropriate destination (e.g., the bypass block 640, the first active core 422, or the second active core 424). In some embodiments, the gain mode selector includes a combination of switches or transistors or other similar components to accomplish the selective directing of input signals along targeted paths.

Figure 7:
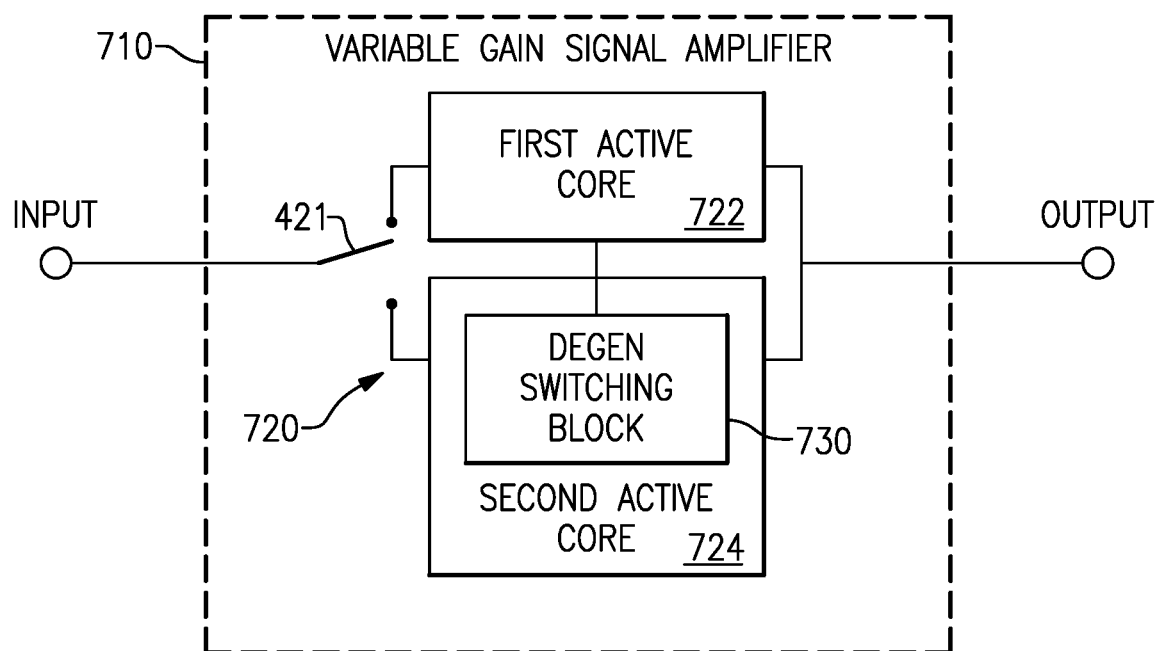
FIG. 7 illustrates a variable-gain signal amplifier that includes a degeneration switching block coupled to active cores of the variable-gain stage.

FIG. 7 illustrates a variable-gain signal amplifier 710 that includes a degeneration switching block 730 coupled to active cores 722, 724 of the variable-gain stage 720. The degeneration switching block 730 can be configured to provide a plurality of inductances for different gain levels of the variable-gain stage 720. The degeneration switching block 730 can be configured to provide various impedance values associated with the various gain levels. The degeneration switching block 730 is coupled to the active cores 722, 724 and can be implemented as part of one of the cores, such as the second active core 724. In some implementations, each active core has a degeneration component, such as an inductive degeneration or a degeneration switching circuit.

Figure 8A:
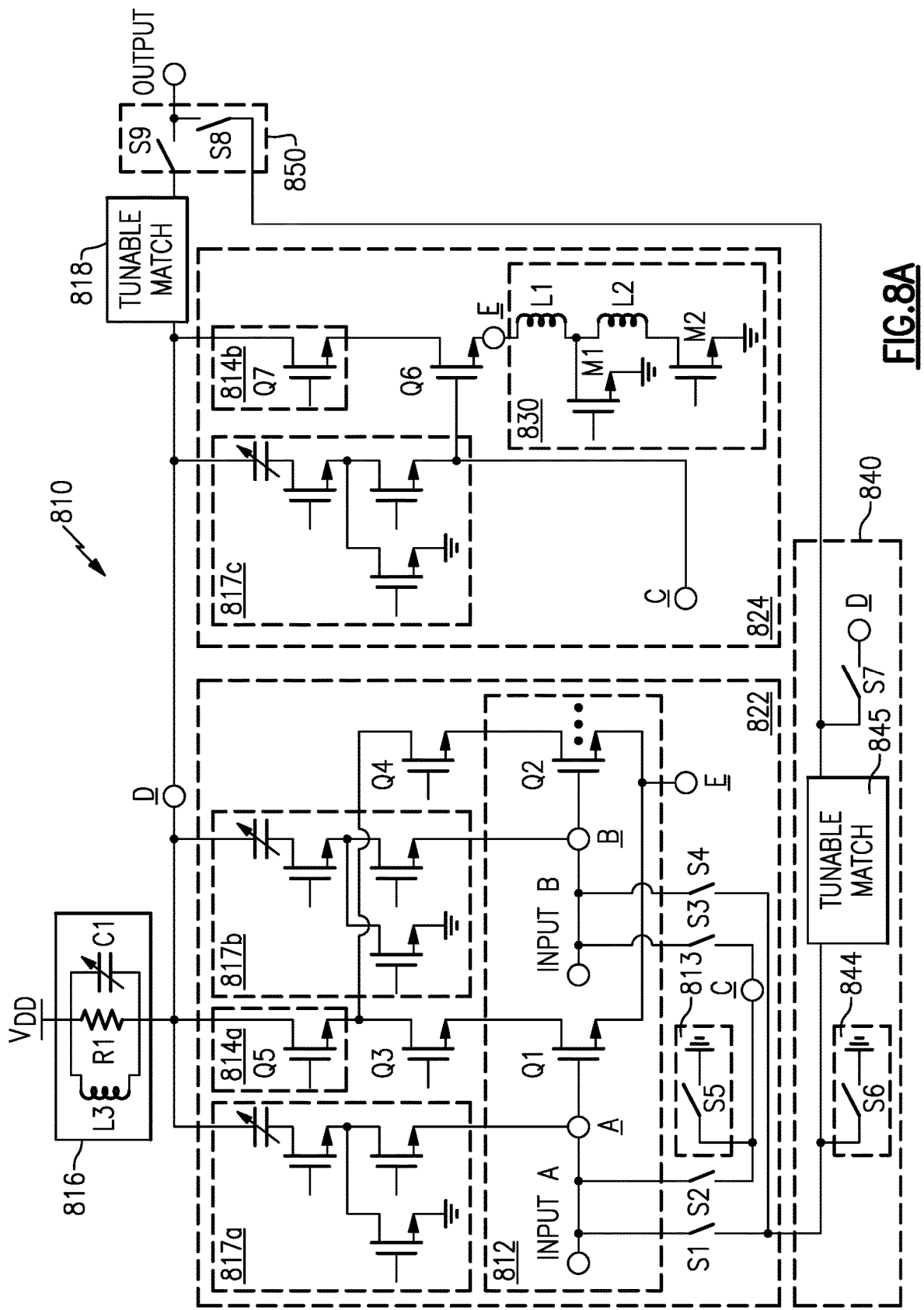
FIG. 8A illustrates an example variable gain amplifier configuration that is configured similarly to the variable gain amplifier of FIG. 3E.
Figure 8B:
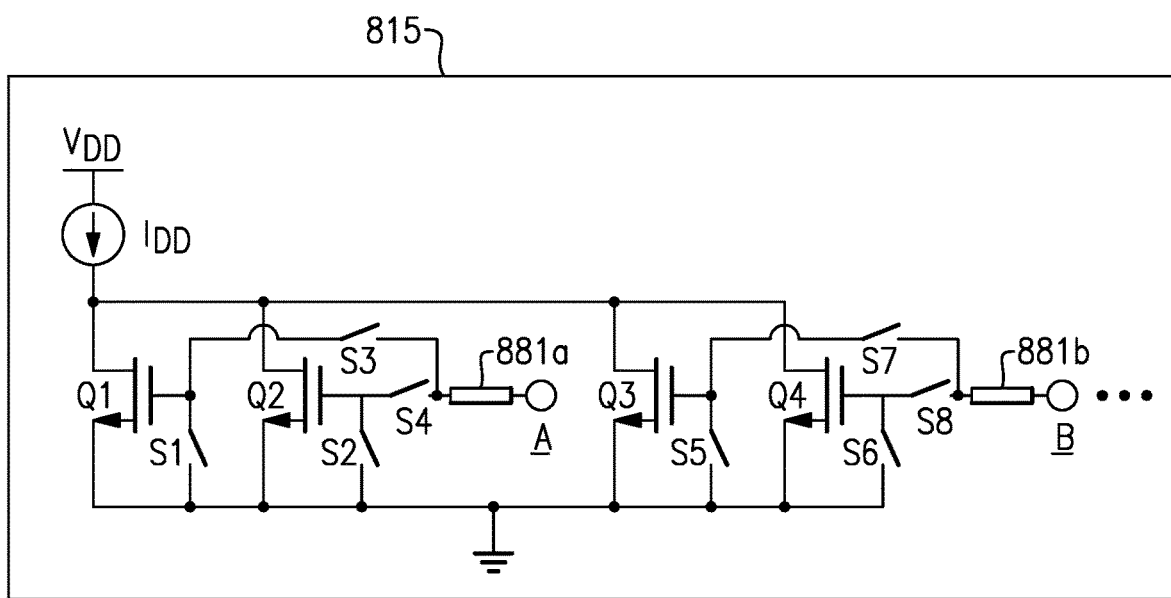
FIG. 8B illustrates a switchable reference bias circuit used in conjunction with the amplifier configuration of FIG. 8A.

FIGS. 8A and 8B illustrate an example variable gain amplifier configuration 810 that is configured similarly to the variable gain amplifier 310d described herein with reference to FIG. 3E. The variable gain amplifier 810 includes example electrical components to demonstrate an example implementation of the amplifier 810. It is to be understood, however, that this is merely an illustrative example implementation and the scope of the disclosure extends to additional implementations encompassing similar architectures.

The variable gain amplifier configuration 810 includes a first active core 822, a second active core 824, and a bypass block 840. Signals are received at inputs A and B and, depending on the gain mode, directed through the first active core 822, the second active core 824, or the bypass block 840 to the output. In some embodiments, the first active core 822 is configured to amplify signals in a high gain mode or in a plurality of high gain modes, the first active core 822 configured to reduce NF relative to the second active core. In some embodiments, the second active core 824 is configured to amplify signals in a low gain mode or in a plurality of low gain modes, the second active core 824 configured to enhance linearity or improve IIP3 relative to the first active core 822. The bypass block 840 is configured to provide signals a bypass path in a lowest gain mode. In some embodiments, the first active core 822 can be referred to as a high gain core or a low NF core. In some embodiments, the second active core 824 can be referred to as a linearity boost core, a medium gain core, or a low gain core.

The first active core 822 includes a multi-input gain stage 812 configured to receive inputs A and B and to selectively amplify the received signals with corresponding transistors Q1 and Q2 in conjunction with corresponding transistors Q3 and Q4 and a cascode buffer 814a with the transistor Q5. The first active core 822 includes feedback caps 817a, 817b coupled between the output and inputs A and B, respectively. The variable capacitor can be tuned to improve IIP3 linearity and/or to match input impedance. The feedback caps 817a, 817b are configured to provide a way to control linearity of the amplification process. The feedback caps 817a, 817b are also configured to provide a targeted input impedance.

The multi-input gain stage 812 provides a voltage to current gain stage comprising the transistors Q1 and Q2. Further, the multi-input gain stage 812 is configured to amplify respective input signals in conjunction with transistors Q3 and Q4 and the cascode buffer 814a that acts as a current buffer to lower input impedance and to increase output impedance.

The first active core 822 includes isolation switch 813, having switch S5, configured to isolate input to the first active core 822 from the second active core 824 when the first active core 822 is active and to isolate input to the bypass block 840 from the second active core 824 when operating in a bypass mode. In other words, switch S5 in the isolation switch 813 is open when the second active core 824 is active and closed during other operating modes (e.g., other gain modes or bypass mode). The amplifier configuration 810 also includes a similar bypass isolation switch 844, having switch S6, in the bypass block 840 to isolate input to the first active core 822 and the second active core 824 from the bypass block 840. In other words, switch S6 in the bypass isolation switch 844 is open when operating in bypass mode and closed during other operating modes (e.g., other gain modes).

The first active core 822 includes switches to selectively direct signals to the second active core 824 rather than through the first active core 822. It is to be understood that although the switches are shown as part of the first active core, these switching elements can be implemented in any part of the amplifier configuration 810. Switches S1 and S4 respectively direct input signals from inputs A and B to the bypass block 840. Switches S2 and S3 respectively direct input signals from inputs A and B to the second active core 824 through the point C. The switches S1-S4 can be implemented using any suitable switching components, such as switches, transistors, or the like. The switches S1-S4 can be operated based at least in part on the gain mode of the amplifier configuration 810. For example, in a high gain mode, the switches S1-S4 can be open to direct signals from inputs A or B through the first active core. In one or more other gain modes, the switches S2 or S3 can be closed (with the remaining switches open) to direct signals through the second active core 824. In a bypass mode or in a lowest gain mode, the switches S1 or S4 can be closed (with the remaining switches open) to direct signals along a bypass path through the bypass block 840.

Similar to the first active core 822, the second active core 824 has an amplification chain that includes a transistor Q6 and a cascode buffer 814b with the transistor Q7. The gate voltages can be different for different cascode buffers 814a, 814b in the different active cores 822, 824. Linearity depends at least in part on how the cascode buffers 814a, 814b are biased. This provides an additional method of tuning performance of the active cores 822, 824, e.g., to enhance linearity in the second active core 824 relative to the first active core 822.

The second active core 824 includes a feedback cap 817c coupled to the point C, or the input to the second active core 824 from input A or input B. The feedback cap 817c is configured to provide a way to control linearity of the amplification process and to provide a targeted input impedance.

The second active core 824 includes a degeneration switching block 830 that is configured to selectively provide tailored impedances based at least in part on a gain mode of the variable gain amplifier configuration 810. The degeneration switching block 830 is also coupled to the amplification path of the first active core 822 at point E. In this way, the first active core 822 and the second active core 824 share the degeneration switching block 830. In certain implementations, the multi-input gain stage 812 is configured to receive multiple signals at distinct input ports, each distinct input port configured to receive signals at one or more particular cellular frequency bands. For example, input A receives a signal in a first band and input B receives a signal in a second band. In some embodiments, each of the transistors Q1, Q2, and Q6 can be coupled to a dedicated degeneration switching block 830 to increase isolation between input ports.

The degeneration switching block 830 is configured to provide impedance to the gain stage of the multi-input gain stage 812 of the first active core 822 or the transistor Q6 of the second active core 824. This can improve performance by providing power and/or noise matching with prior stages in the processing chain. The degeneration switching block 830 can be configured to improve linearity of the gain stage (e.g., transistors Q1, Q2, or Q6) by providing a feedback mechanism. The degeneration switching block 830 can be configured to provide a first impedance L1 for a first gain mode and a second impedance provided by L1 and L2 for a second gain mode by respectively activating the transistor M1 and the transistor M2. The selected impedances provided by the degeneration switching block 830 can also be configured to improve linearity of the gain stage. In a bypass mode, the transistors M1 and M2 can be off. The variable gain amplifier configuration 810 can be configured to bypass the first active core 822 and the second active core 824 in a bypass mode. This can improve linearity performance by reducing or minimizing leakage current passing through the respective active cores 822, 824. In certain implementations, the degeneration switching block 830 can be configured to provide a lower inductance for higher gain modes. The amount of inductance provided by the degeneration switching block 830 can change with changes in gain mode of the variable gain amplifier configuration 810.

The degeneration switching block 830 can be configured to change inductance to increase performance of the variable gain amplifier 810 relative to an amplifier with fixed inductance. Performance can be increased by increasing linearity and/or by reducing noise introduced during amplification, for example.

The bypass block 840 is configured to receive signals from the multiple inputs and to provide a path to the output that does not pass through the first active core 822 or the second active core 824. The bypass block 840 is configured to provide a path to the output through tunable matching network 845, similar to the matching network 345 described herein with reference to FIG. 3E. The bypass block 840 can be configured to provide two paths to the output, a direct path and an output tank path, activated by closing switch S7.

The output tank path is directed to a path that is coupled to an output load 816 at point D, the output load similar to the output load 316 described herein with reference to FIG. 3E. The bypass block 840 also includes a bypass isolation switch 844, or shunt switch, that selectively couples the bypass block 840 to a reference potential node to aid in isolating the inputs from the output. The bypass matching network 845 can provide additional impedance matching flexibility.

The variable gain amplifier configuration 810 can be configured to provide multi-input processing without the use of a switching network. The variable gain amplifier configuration 810 can be configured to achieve relatively high linearity through the use of the degeneration switching block 830. The variable gain amplifier configuration 810 can be configured to provide a low-loss direct bypass mode by directing signals from the inputs through the bypass block 840. The low-loss direct bypass mode can be implemented in a low gain mode, for example.

The amplifier configuration 810 includes a bypass switch 850 that is configured to selectively provide a path from input A or input B through the bypass block 840 to the output or a path from input A or input B through one of the active cores 822, 824 to the output. The bypass switch 850 includes switches S8 and S9 that respectively control connection of a bypass path to the output and an amplification path to the output. The bypass switch 850 can be controlled based at least in part on a gain mode of the variable gain amplifier 810.

The matching networks 818 and 845 can include any suitable combination of inductors and capacitors that can be used to provide targeted impedances. The output matching network 818 is configured to provide impedance matching for an output load 816 and the active cores 822, 824. The bypass matching network 845 similarly provides impedance matching for the bypass block 840.

The variable gain amplifier 810 includes the output load 816 and cascode buffers 814a, 814b as part of the amplification path. The cascode buffers 814a, 814b includes respective transistors Q5 and Q7 that are configured to act as current buffers. The cascode buffers 814a, 814b are configured to provide isolation between the gain stages of the respective active cores 822, 824 and the output. The cascode buffers 814a, 814b can also be configured to provide a targeted gain for the respective active cores 822, 824. The output load 816 is configured to provide a load to current to generate an output voltage swing. The output load 816 can be configured to be tuned or tunable for each band received at the inputs. For example, the output load 816 includes a variable capacitor C1 that can be tuned for particular cellular frequency bands. The output load 816 can also be configured to improve return loss and/or increase bandwidth by tailoring the resistance R1 of the output load 816.

FIG. 8B illustrates a switchable reference bias circuit 815 used in conjunction with the amplifier configuration 810 of FIG. 8A. The switchable reference bias circuit 815 is coupled to the amplifier configuration 810 of FIG. 8A at points A and B. The switchable reference bias circuit 815 includes a power supply voltage, $V_{DD}$, and a current source, $I_{DD}$. The current is selectively directed through transistors Q1-Q4 through the use of switches S1-S8. This can be used to provide targeted current matching for the active cores 822, 824. For example, switches S2 and S3 can be closed and switches S1 and S4 can be opened when operating in a gain mode that uses the first active core 822 to amplify signals from input A. Similarly, switches S1 and S4 can be closed and switches S2 and S3 can be opened when operating in a gain mode that uses the second active core 824 to amplify signals from input A. Likewise, switches S6 and S7 can be closed and switches S5 and S8 can be opened when operating in a gain mode that uses the first active core 822 to amplify signals from input B. Similarly, switches S6 and S7 can be closed and switches S5 and S8 can be opened when operating in a gain mode that uses the second active core 824 to amplify signals from input B. In some embodiments, when amplifying signals from input A, switches S5 and S6 are closed and switches S7 and S8 are opened to deactivate transistors Q3 and Q4 in the switchable reference bias circuit 815. Similarly, when amplifying signals from input B, switches S1 and S2 are closed and switches S3 and S4 are opened to deactivate transistors Q1 and Q2. This can be extended to more than two inputs (e.g., inputs in addition to input A and input B).

The switchable reference bias circuit 815 includes a resistor 881a between the point A in FIGS. 8A and 8B and the switch S4. Similarly, the switchable reference bias circuit 815 includes a resistor 881b between the point B in FIGS. 8A and 8B and the switch S8. The resistors 881a, 881b are configured to isolate the switchable reference bias circuit 815 from the active amplification cores. The resistors 881a, 881b can be configured to provide a relatively high RF impedance to the switchable reference bias circuit 815 and/or to prevent or reduce noise from passing from the switchable reference bias circuit 815 to the active amplification core 822, 824.

It is to be understood that although FIGS. 8A and 8B illustrate an amplifier configuration 810 having two inputs (inputs A and B), the amplifier configuration 810 can be configured to receive more than 2 inputs, such as 3 or more inputs, 4 or more inputs, 5 or more inputs, etc.

Figure 9A:
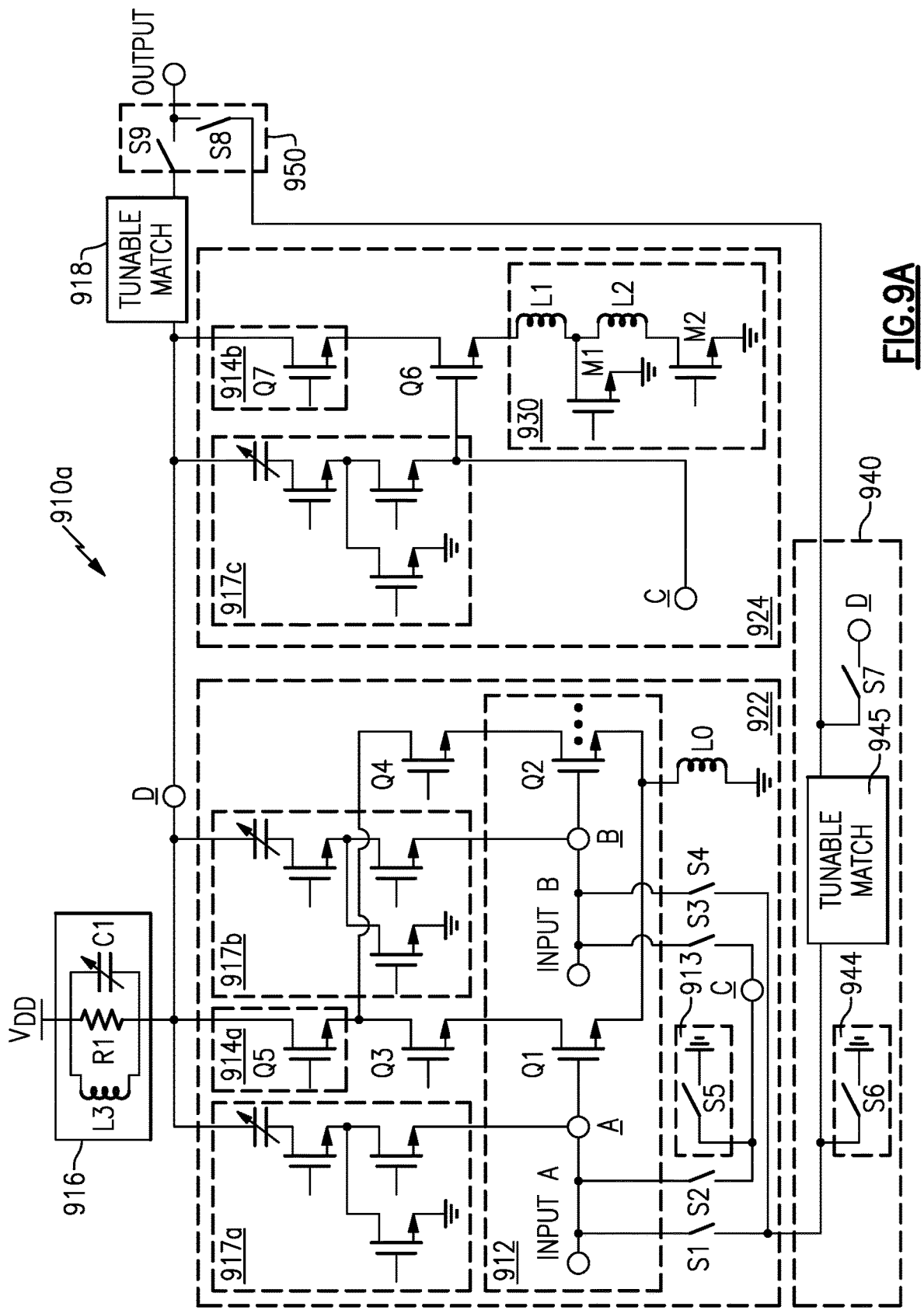
FIG. 9A illustrates another example amplifier configuration that is similar to the amplifier configuration described herein with reference to FIG. 8A with the inclusion of an inductor coupled to the multi-input gain stage.

FIG. 9A illustrates another example amplifier configuration 910a that is similar to the amplifier configuration 810 described herein with reference to FIGS. 8A and 8B. The difference between the amplifier configuration 910a and the amplifier configuration 810, is that the amplifier configuration 910a includes inductor L0 coupled to the multi-input gain stage 912 rather than coupling the multi-input gain stage to the degeneration switching block 930, as was done in the amplifier configuration 810. The inductor L0 can provide inductive degeneration for the first active core 922 while the degeneration switching block 930 can provide similar functionality, described herein, for the second active core 922. Thus, the amplifier configuration 910a is configured to provide separate degeneration elements for each active core 822, 824.

This may be extended to amplifier configurations having more than 2 active cores. Configurations can also be implemented where 2 or more active cores share a degeneration switching circuit with 1 or more different active cores including their own degeneration elements. The inductors L0, L1, and L2 are configured to provide real impedance to the amplifier inputs. This may be beneficial for power and/or noise matching with prior stages in the amplification or signal processing chain. Furthermore, the inductors L0, L1, and L2 are configured to improve linearity of the respective active cores by providing a series feedback mechanism. For example, when high linearity is desirable, both L1 and L2 can be activated.

Figure 9B:
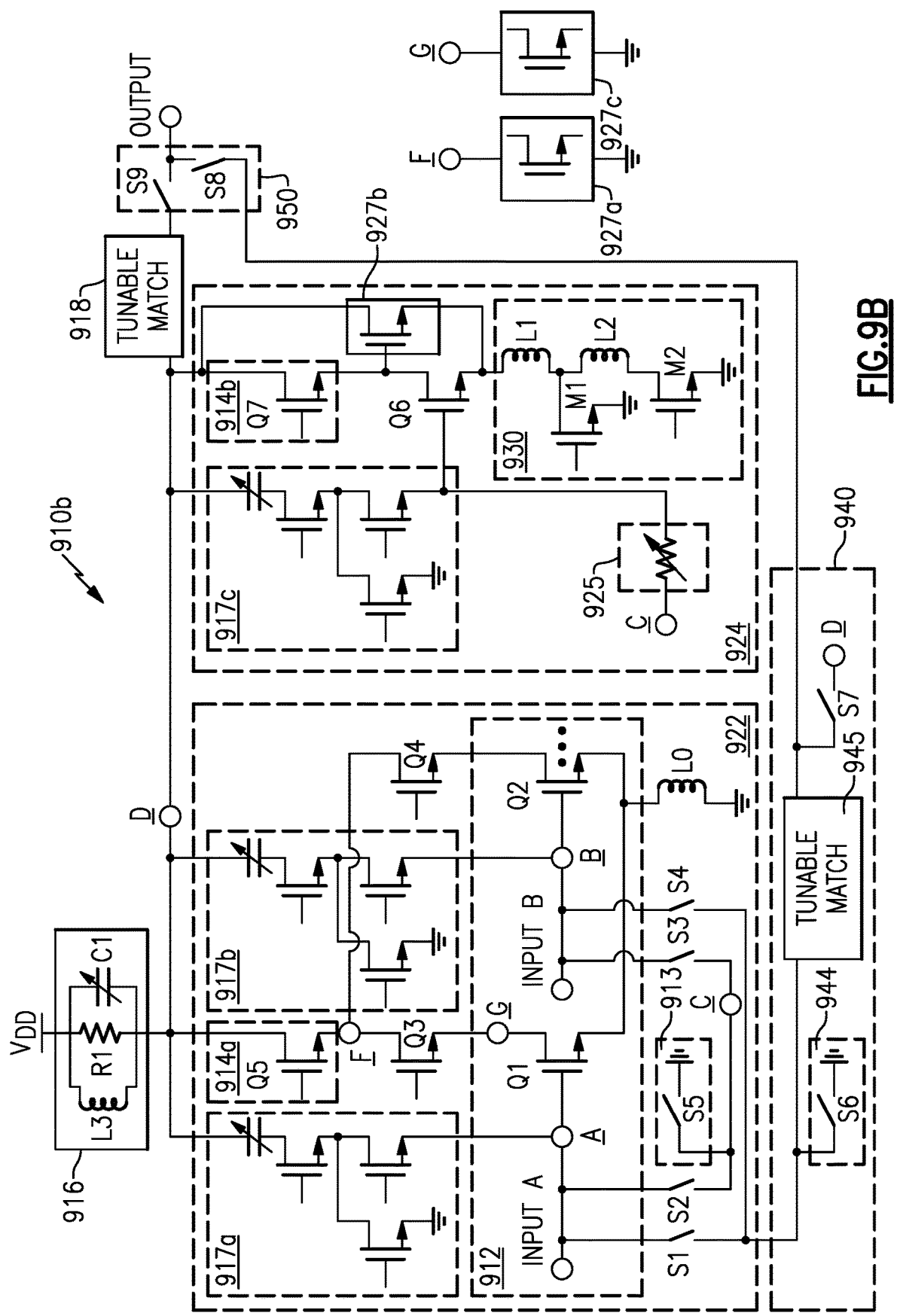
FIG. 9B illustrates another example amplifier configuration that adds a variable attenuator in the second active core relative to the amplifier configuration of FIG. 9A.

FIG. 9B illustrates another example amplifier configuration 910b that adds some components to the amplifier configuration 910a described herein with reference to FIG. 9A. Relative to the amplifier configuration 910a, the amplifier configuration 910b includes a variable attenuator 925 in the second active core 924. The variable attenuator 925 can be selectively used to attenuate signals prior to amplification in the second active core 924. The variable attenuator 925 can be activated to decrease signal levels, which can boost linearity and increase NF, however this increase in NF may be more tolerable in lower gain modes than in high gain modes.

The amplifier configuration 910b also includes third-order transconductance cancellation blocks (or gm3 cancellation blocks) 927a, 927b, 927c included in the first active core 922 and the second active core 924, respectively. In the first active core 922, the gm3 cancellation block 927a is coupled to the amplification path at point F. In the second active core 924, the gm3 cancellation block 927b is coupled to the amplification path between transistor Q6 and the cascode buffer 914b, the gm3 cancellation block including a transistor with the gate coupled to the drain of transistor Q6, a drain coupled to the drain of the transistor Q7 of the cascode buffer, and a source coupled to the source of the transistor Q6. The gm3 cancellation blocks 927a, 927b, 927c can be configured to further improve IIP3 linearity of the respective active cores 922, 924. The gm3 cancellation blocks 927a, 927b, 927c can be modular in that they can be selectively included in one or more active cores. The gm3 cancellation blocks 927a, 927b, 927c function to improve performance by injecting current with an opposite sign of the third-order transconductance current in the main amplification paths (e.g., the transistors Q3, Q4, and Q6). The gm3 cancellation blocks 927a, 927b, 927c can include an active MOSFET, resistor, capacitor, or any combination of these and other components. In some embodiments, the point F can be coupled to the drain of Q1, to the drain of Q2, and/or to the drain of Q6. In some embodiments, the point G can be removed so that there are two gm3 cancellation blocks 927a, 927b. In some embodiments, the gm3 cancellation block 927b can be implemented in the first active core 922. In such embodiments, the gm3 cancellation block 927b can be coupled to the drain of Q1 and/or to the drain of Q2 in a manner similar to how it is coupled to the drain of Q6 in FIG. 9B. In some embodiments, the point G can be coupled to the drain of Q2 and/or to the drain of Q6.

Figure 10A:
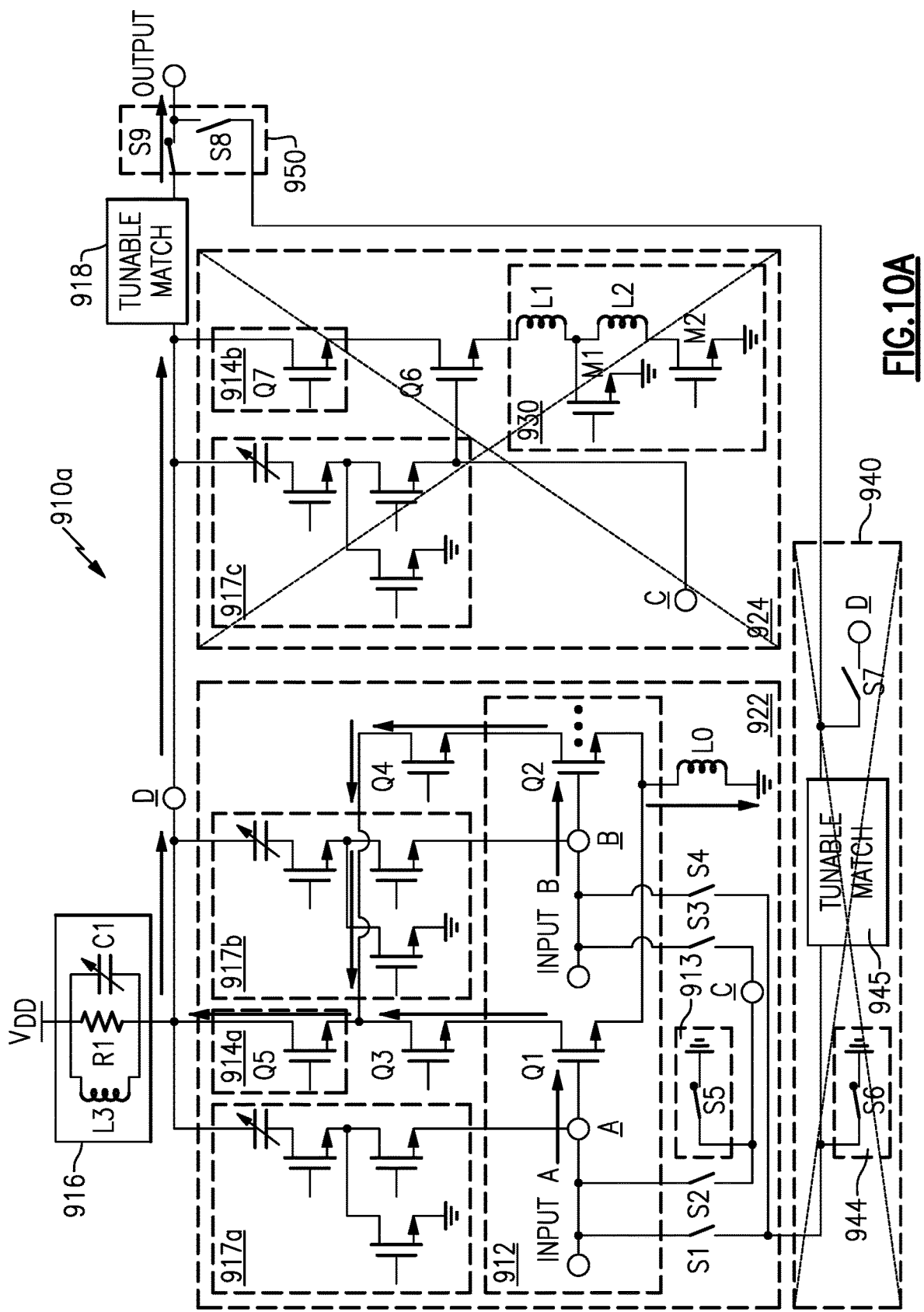
FIGS. 10A, 10B, 10C, 10D, and 10E illustrate examples of operating modes of the variable gain signal amplifier configuration of FIG. 9A.
Figure 10B:
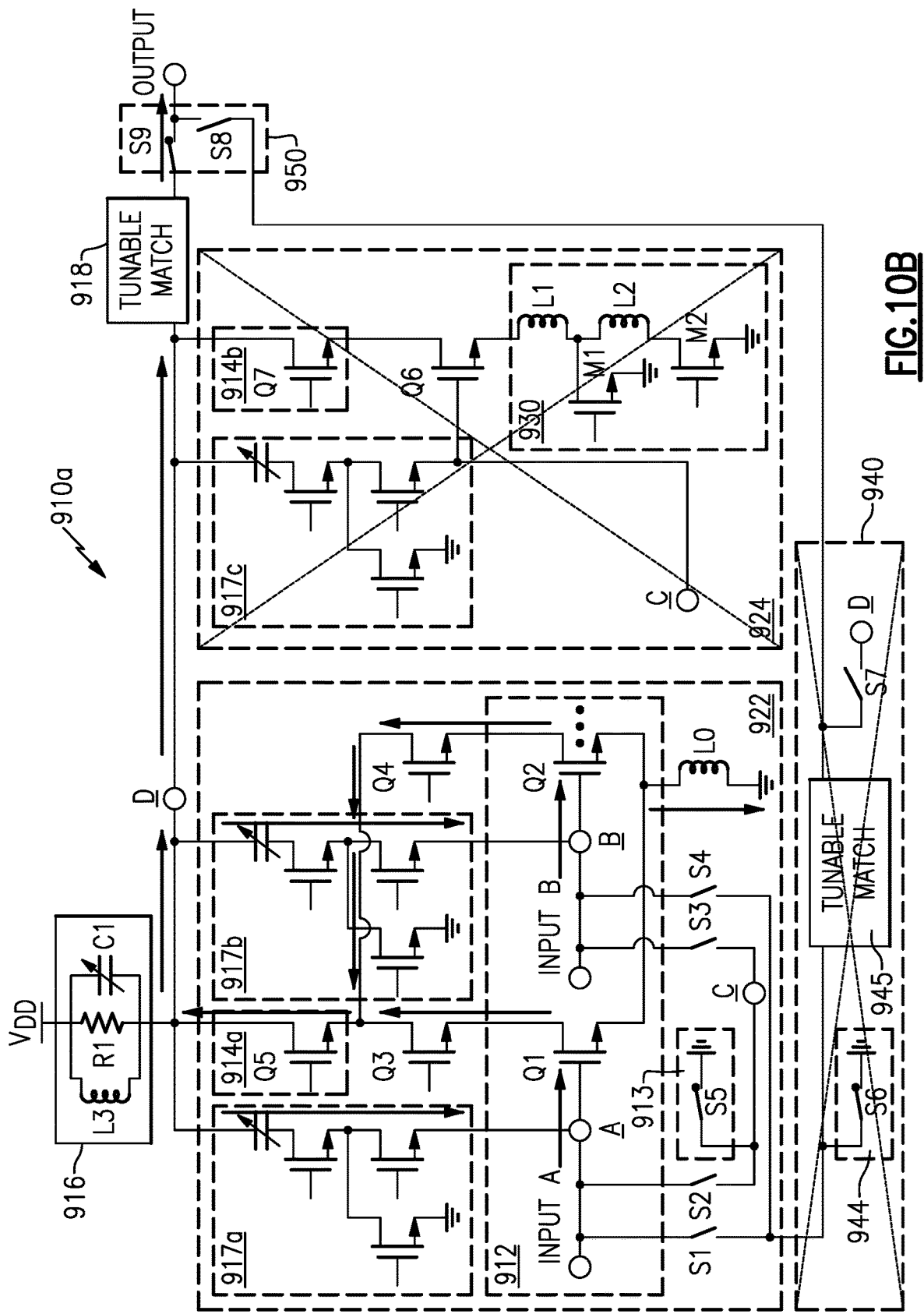

FIGS. 10A-10E illustrate examples of operating modes of the variable gain signal amplifier configuration 910a of FIG. 9A. FIGS. 10A and 10B illustrate operation in one or more high gain modes, which may also be referred to as low NF modes, for amplifying signals from input A and input B. In these high gain modes, the first active core 922 is activated, the second active core 924 is deactivated, and the bypass block 940 is deactivated, except for the bypass isolation switch 944 (which is closed). In FIG. 10A, signals received at the input A are directed through the multi-input gain stage 912 comprising transistor Q1, through transistor Q3, and through the cascode buffer 914a to the output through the output matching network 918 and the bypass switch 950. Similarly, signals received at the input B are directed through the multi-input gain stage 912 comprising transistor Q2, through transistor Q4, and through the cascode buffer 914a to the output through the output matching network 918 and the bypass switch 950. The bypass switch 950 closes switch S9 and opens switch S8 in these high gain modes. For signals from both input A and input B, the amplifier configuration 910a provides inductive degeneration to the gain stage through inductor L0. Switches S1-S4 are open so signals do not propagate to the second active core 924 or the bypass block 940. Furthermore, isolation switch 913 is closed to further isolate the inputs from the second active core 924. In FIG. 10B, the first active core 922 is activated to amplify signals received at input A and input B, as in FIG. 10A, with feedback loops activated through feedback caps 917a and 917b.

Figure 10C:
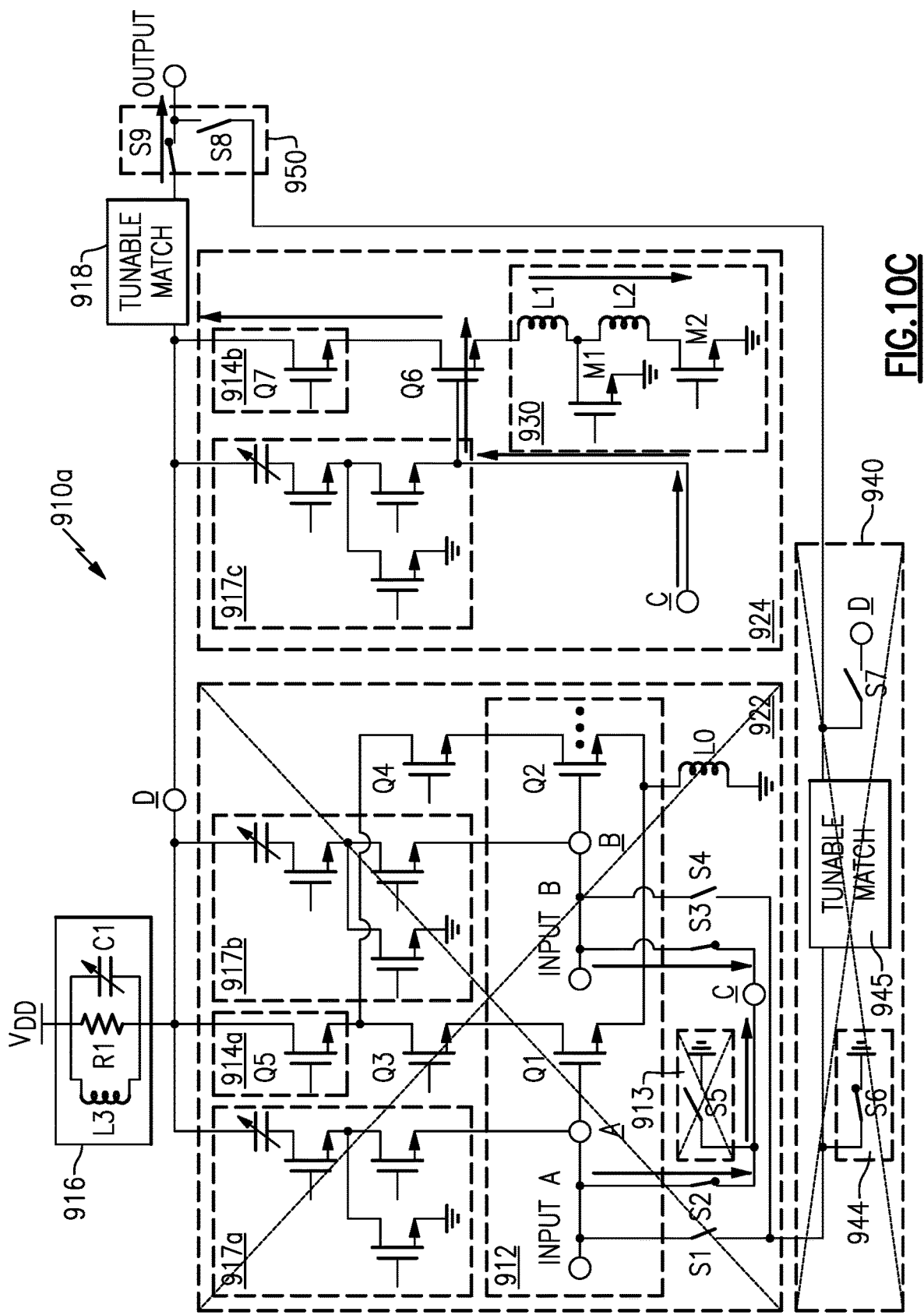
Figure 10D:
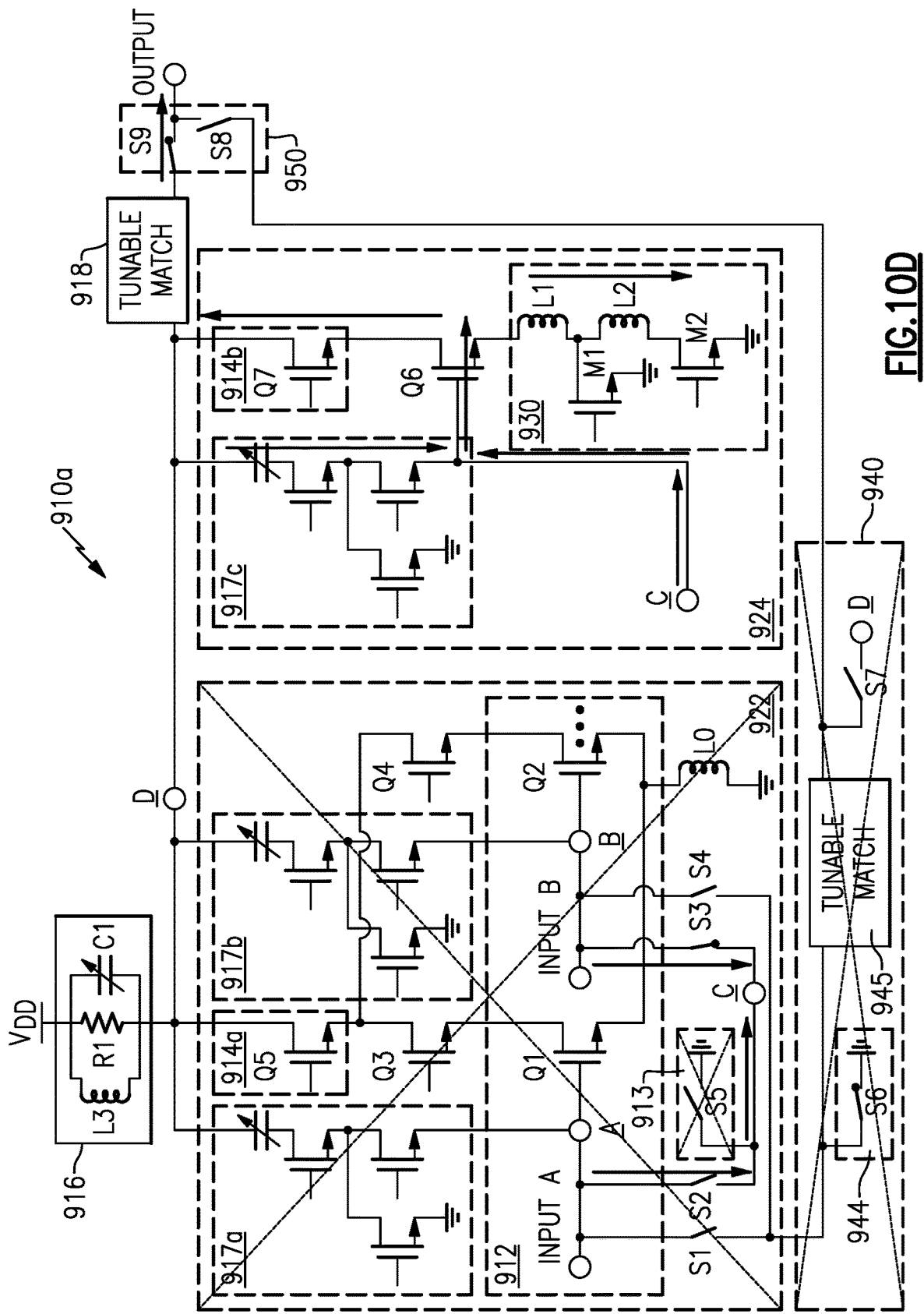

FIGS. 10C and 10D illustrate operation in one or more medium gain modes for amplifying signals from input A and input B. These modes may also be referred to as low gain or high linearity modes. In these medium gain modes, the first active core 922 is deactivated, the second active core 924 is activated, and the bypass block 940 is deactivated, except for the bypass isolation switch 944 (which is closed). In FIG. 10C, signals received at input A are directed to the point C through closed switch S2 (with switch S3 open). Similarly, signals received at input B are directed to the point C through closed switch S3 (with switch S2 open). For signals received from input A or input B, the signals then pass through gain stage transistor Q6 and cascode buffer 914b to the output through the output matching network 918 and the bypass switch 950. The bypass switch 950 closes switch S9 and opens switch S8 in these medium gain modes. Selective inductive degeneration is provided to the gain stage through the degeneration switching block 930. The degeneration switching block can selectively activate transistor M2 (with M1 activated) to provide a selected inductance to the second active core 924. This allows the second active core 924 to increase impedance for lower gain modes, or, to decrease impedance for higher gain modes. Switches S1 and S4 are open so signals do not propagate to the bypass block 940. Furthermore, isolation switch 913 is open to allow signals to propagate to the second active core 924. In FIG. 10D, the feedback cap 917c is activated to provide a feedback loop to the second active core 924.

Figure 10E:
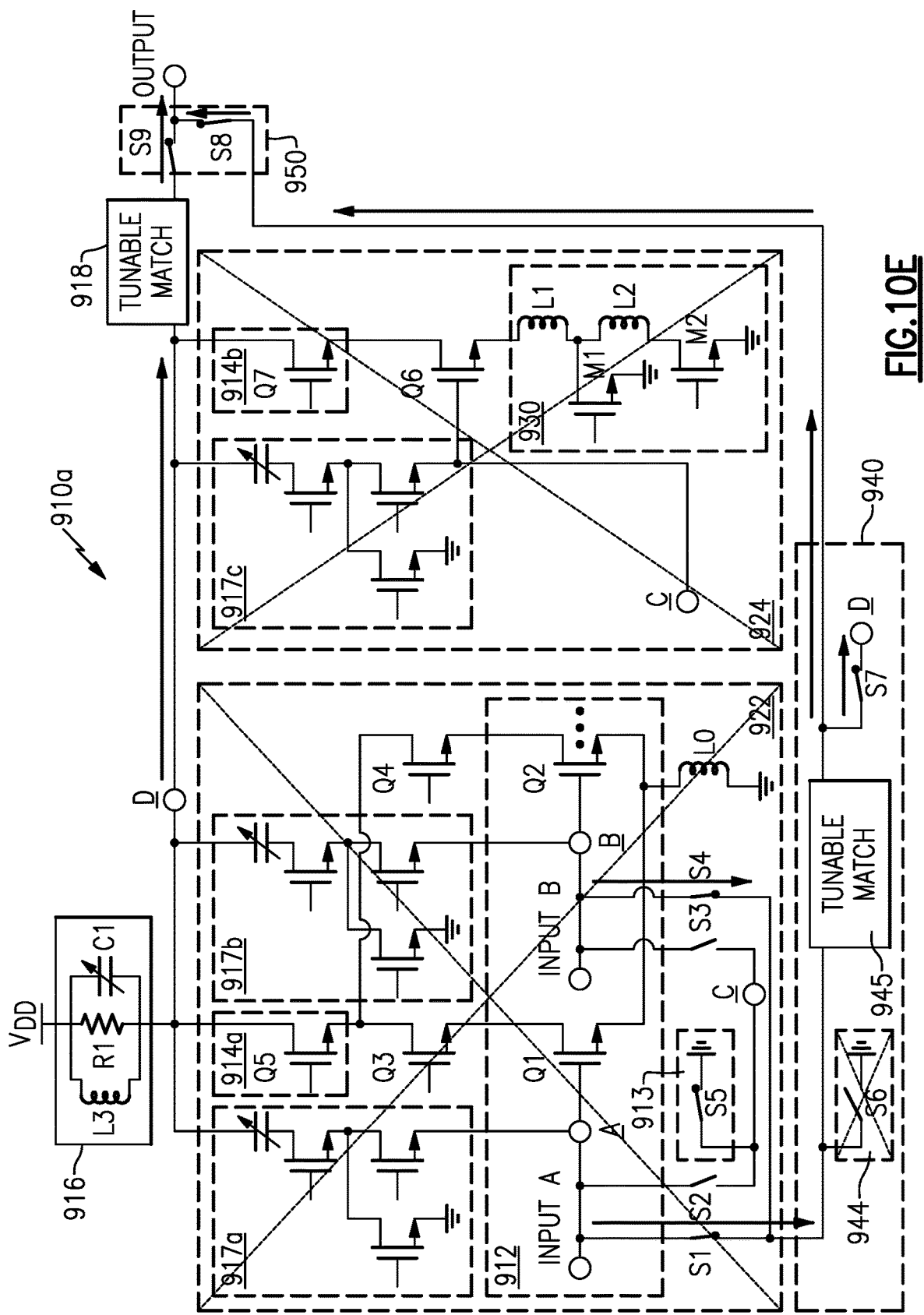

FIG. 10E illustrates operation in a low gain mode or a passive bypass mode for signals received from input A or input B. In the bypass mode, the bypass block 940 is activated and the active cores 922, 924 are deactivated, except isolation switch 913 (which is closed). Signals received at input A are directed through the bypass block 940 by closing switch S1 and through the bypass matching network 945 and to the output through the bypass switch 950 by opening switch S9 and closing switch S8. Signals received at input B are directed through the bypass block 940 by closing switch S4 and through the bypass matching network 945 and to the output through the path coupled to the tunable output load 916 at point D, activated by closing switches S7 and S9 and opening switch S8. It should be noted that signals from input A can be routed to the output through the path that includes point D, and that signals from input B can be routed to the output through the path that does not include point D. Furthermore, the transistors M1 and M2 are off to deactivate the degeneration switching block 930 to improve linearity performance by reducing or minimizing leakage current through the gain stage transistors. In bypass mode for input A, switch S1 is closed with switches S2, S3, and S4 open. In bypass mode for input B, switch S4 is closed with switches S1, S2, and S3 open. The bypass isolation switch 944 is deactivated in the bypass mode.

Figure 11A:
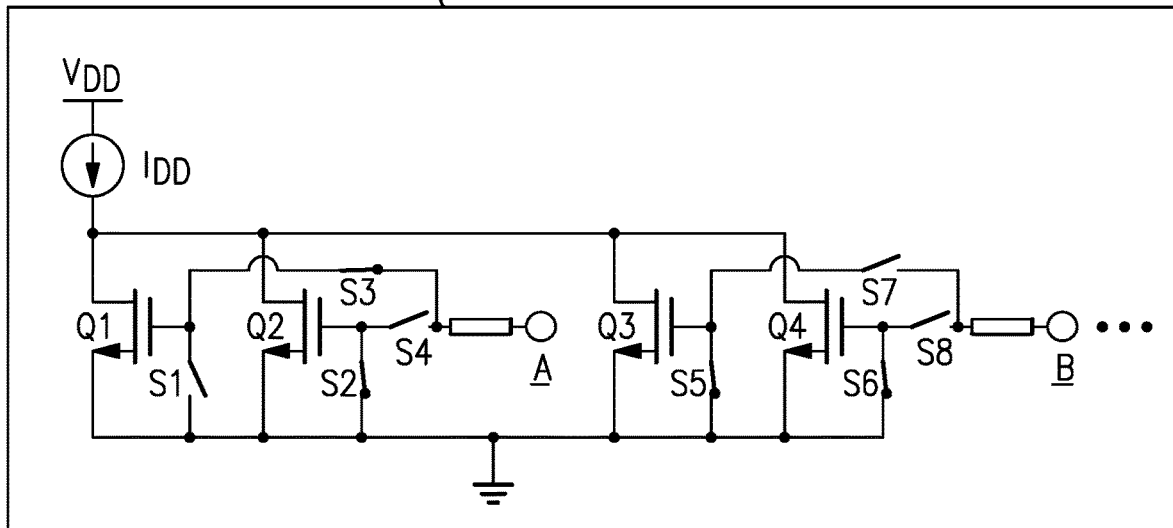
FIGS. 11A, 11B, 11C, and 11D illustrate operation of a switchable reference bias circuit in different gain modes for signals from different inputs.
Figure 11B:
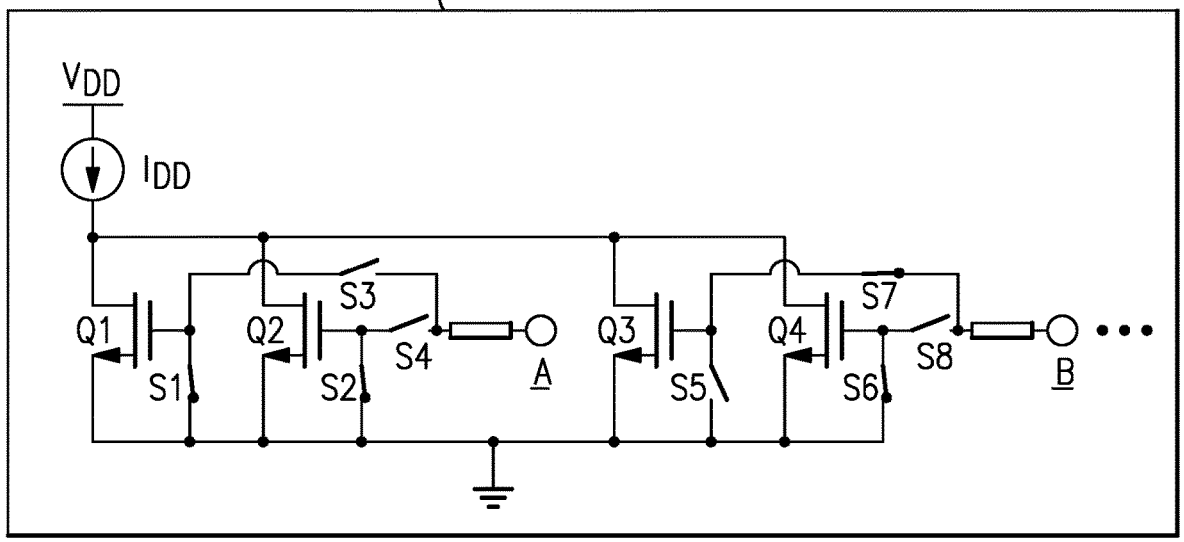
Figure 11C:
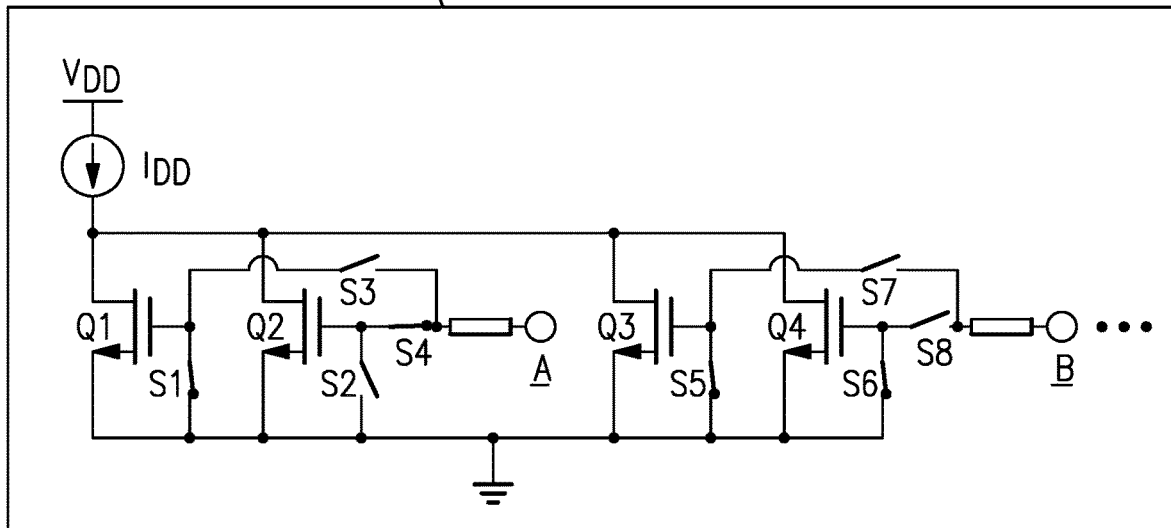
Figure 11D:
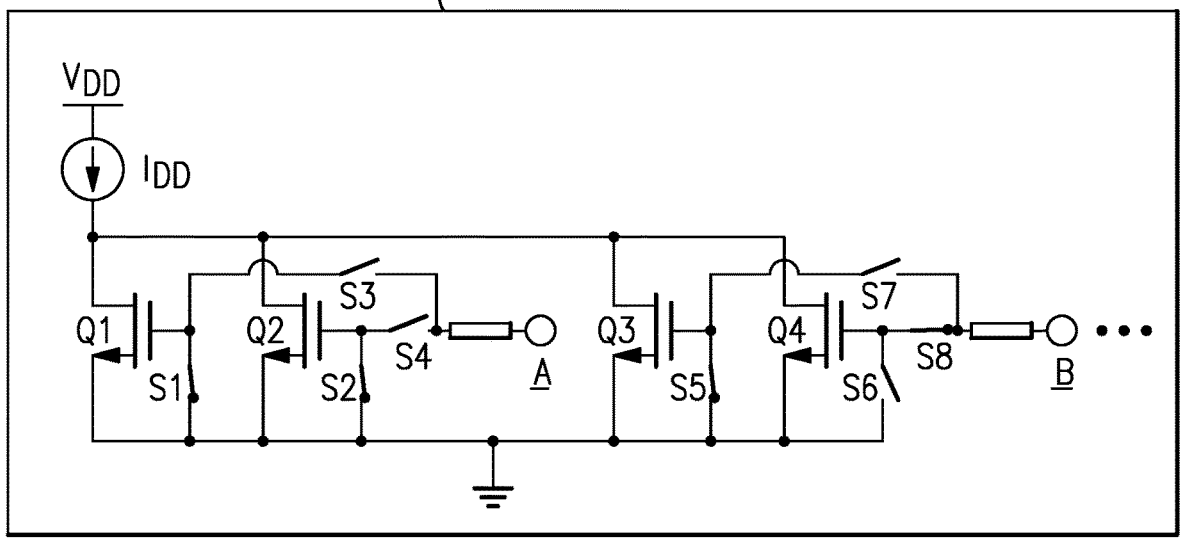

FIGS. 11A-11D illustrate operation of a switchable reference bias circuit 1115 in different gain modes for signals from input A or input B. The switchable reference bias circuit 1115 is configured like the switchable reference bias circuit 815 described herein with reference to FIG. 8B. FIG. 11A illustrates that, in one or more high gain modes, when the first active core is activated and signals are received at input A such as in FIG. 10A or FIG. 10B, switch S3 is closed to activate transistor Q1 and switches S2, S5, and S6 are closed to respectively deactivate transistors Q2, Q3, and Q4, with the remaining switches S1, S4, S7, and S8 open. FIG. 11B illustrates that, in one or more high gain modes, when the first active core is activated and signals are received at input B such as in FIG. 10A or FIG. 10B, switch S7 is closed to activate transistor Q3 and switches S1, S2, and S6 are closed to respectively deactivate transistors Q1, Q2, and Q4, with the remaining switches S3, S4, S5, and S8 open. FIG. 11C illustrates that, in one or more medium or low gain modes, when the second active core is activated and signals are received at input A such as in FIG. 10C or FIG. 10D, switch S4 is closed to activate transistor Q2 and switches S1, S5, and S6 are closed to respectively deactivate transistors Q1, Q3, and Q4, with the remaining switches S2, S3, S7, and S8 open. FIG. 11D illustrates that, in one or more medium or low gain modes, when the second active core is activated and signals are received at input B such as in FIG. 10C or FIG. 10D, switch S8 is closed to activate transistor Q4 and switches S1, S2, and S5 are closed to respectively deactivate transistors Q1, Q2, and Q3, with the remaining switches S3, S4, S6, and S7 open.

Examples of Products and Architectures

Figure 12:
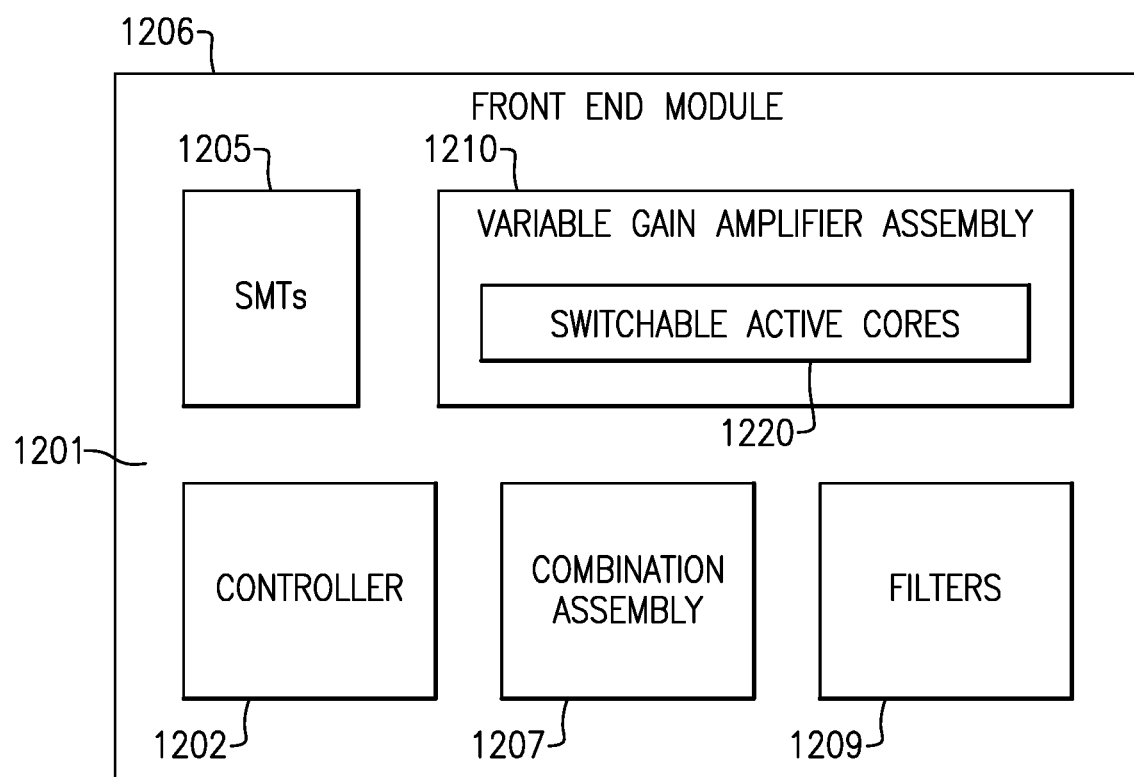
FIG. 12 illustrates that in some embodiments, some or all of the amplifier configurations, including some or all of the amplifier configurations having the combinations of features described herein, can be implemented, wholly or partially, in a module.

FIG. 12 illustrates that in some embodiments, some or all of the amplifier configurations, including some or all of the amplifier configurations having the combinations of features described herein (e.g., FIGS. 1-11D), can be implemented, wholly or partially, in a module. Such a module can be, for example, a front-end module (FEM). Such a module can be, for example, a diversity receiver (DRx) FEM. Such a module can be, for example, a multi-input, multi-output (MiMo) module.

In the example of FIG. 12, a module 1206 can include a packaging substrate 1201, and a number of components can be mounted on such a packaging substrate 1201. For example, a controller 1202 (which may include a front-end power management integrated circuit [FE-PIMC]), a combination assembly 1207, a variable gain amplifier assembly 1210 that includes switchable active cores 1220 having one or more features as described herein, and a filter bank 1209 (which may include one or more bandpass filters) can be mounted and/or implemented on and/or within the packaging substrate 1201. Other components, such as a number of SMT devices 1205, can also be mounted on the packaging substrate 1201. Although all of the various components are depicted as being laid out on the packaging substrate 1201, it will be understood that some component(s) can be implemented over other component(s).

In some implementations, a device and/or a circuit having one or more features described herein can be included in an RF electronic device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 13:
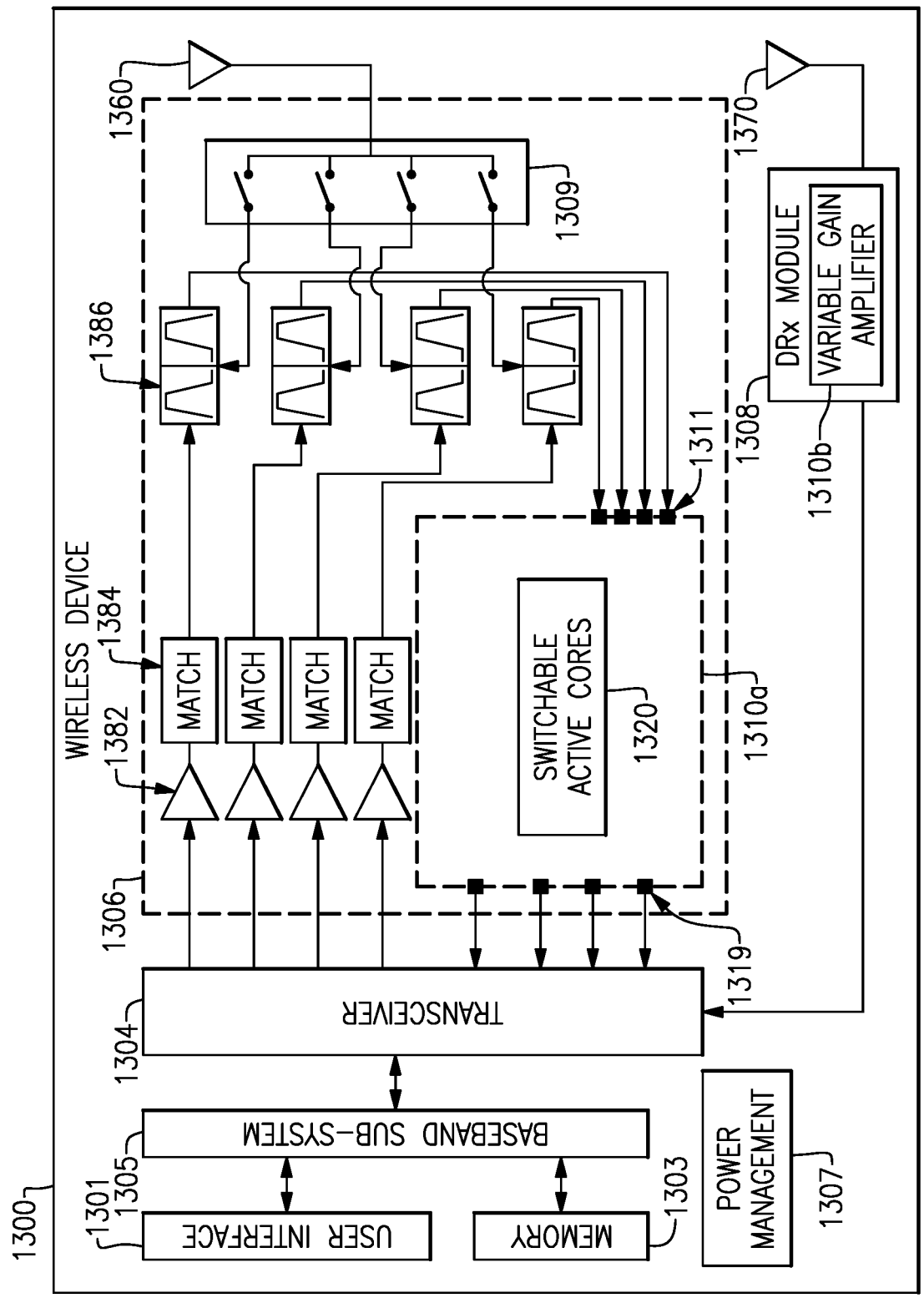
FIG. 13 illustrates an example wireless device having one or more advantageous features described herein.

FIG. 13 depicts an example wireless device 1300 having one or more advantageous features described herein. In the context of one or more modules having one or more features as described herein, such modules can be generally depicted by a dashed box 1306 (which can be implemented as, for example, a front-end module) and a diversity receiver (DRx) module 1308 (which can be implemented as, for example, a front-end module).

Referring to FIG. 13, power amplifiers (PAs) 1382 can receive their respective RF signals from a transceiver 1304 that can be configured and operated to generate RF signals to be amplified and transmitted, and to process received signals. The transceiver 1304 is shown to interact with a baseband sub-system 1305 that is configured to provide conversion between data and/or voice signals suitable for a user and RF signals suitable for the transceiver 1304. The transceiver 1304 can also be in communication with a power management component 1307 that is configured to manage power for the operation of the wireless device 1300. Such power management can also control operations of the baseband sub-system 1305 and the modules 1306 and 1308.

The baseband sub-system 1305 is shown to be connected to a user interface 1301 to facilitate various input and output of voice and/or data provided to and received from the user. The baseband sub-system 1305 can also be connected to a memory 1303 that is configured to store data and/or instructions to facilitate the operation of the wireless device, and/or to provide storage of information for the user.

In the example wireless device 1300, outputs of the PAs 1382 are shown to be matched (via respective match circuits 1384) and routed to their respective duplexers 1386. Such amplified and filtered signals can be routed to a primary antenna 1360 through a switching network 1309 for transmission. In some embodiments, the duplexers 1386 can allow transmit and receive operations to be performed simultaneously using a common antenna (e.g., primary antenna 1360). In FIG. 13, received signals are shown to be routed to a variable gain amplifier assembly 1310*a*, which provides the features and benefits of the variable gain amplifiers described herein. The DRx module 1308 includes a similar variable gain amplifier assembly 1310*b* as well.

In the example wireless device 1300, signals received at the primary antenna 1360 can be sent to a variable gain amplifier 1310*a* in the front-end module 1306. The variable gain amplifier 1310*a* can include switchable active cores 1320. The variable gain amplifier 1310*a* is configured to receive a plurality of signals at inputs 1311 and to output a plurality of processed signals at outputs 1319. The variable gain amplifier 1310*a* is configured to amplify signals by directing signals through a particular active core based at least in part on a gain mode. This can be done to improve NF for high gain modes and to improve linearity for signals for medium and/or low gain modes relative to variable gain amplifiers that do not include one or more of the described features. In at least one low gain mode, the switchable active cores 1320 can be bypassed.

The wireless device also includes a diversity antenna 1370 and a diversity receiver module 1308 that receives signals from the diversity antenna 1370. The diversity receive module 1308 includes a variable gain amplifier 1310*b*, similar to the variable gain amplifier 1310*a* in the front-end module 1306. The diversity receiver module 1308 and the variable gain amplifier 1310*b* process the received signals and transmit the processed signals to the transceiver 1304. In some embodiments, a diplexer, triplexer, or other multiplexer or filter assembly can be included between the diversity antenna 1370 and the diversity receiver module 1370, as described herein.

One or more features of the present disclosure can be implemented with various cellular frequency bands as described herein. Examples of such bands are listed in Table 1. It will be understood that at least some of the bands can be divided into sub-bands. It will also be understood that one or more features of the present disclosure can be implemented with frequency ranges that do not have designations such as the examples of Table 1. It is to be understood that the term radio frequency (RF) and radio frequency signals refers to signals that include at least the frequencies listed in Table 1.

TABLE 1

| Band | Mode | Tx Frequency Range (MHz) | Rx Frequency Range (MHz) |
|---|---|---|---|
| B1 | FDD | 1,920-1,980 | 2,110-2,170 |
| B2 | FDD | 1,850-1,910 | 1,930-1,990 |
| B3 | FDD | 1,710-1,785 | 1,805-1,880 |
| B4 | FDD | 1,710-1,755 | 2,110-2,155 |
| B5 | FDD | 824-849 | 869-894 |
| B6 | FDD | 830-840 | 875-885 |
| B7 | FDD | 2,500-2,570 | 2,620-2,690 |
| B8 | FDD | 880-915 | 925-960 |
| B9 | FDD | 1,749.9-1,784.9 | 1,844.9-1,879.9 |
| B10 | FDD | 1,710-1,770 | 2,110-2,170 |
| B11 | FDD | 1,427.9-1,447.9 | 1,475.9-1,495.9 |
| B12 | FDD | 699-716 | 729-746 |
| B13 | FDD | 777-787 | 746-756 |
| B14 | FDD | 788-798 | 758-768 |
| B15 | FDD | 1,900-1,920 | 2,600-2,620 |
| B16 | FDD | 2,010-2,025 | 2,585-2,600 |
| B17 | FDD | 704-716 | 734-746 |
| B18 | FDD | 815-830 | 860-875 |
| B19 | FDD | 830-845 | 875-890 |
| B20 | FDD | 832-862 | 791-821 |
| B21 | FDD | 1,447.9-1,462.9 | 1,495.9-1,510.9 |
| B22 | FDD | 3,410-3,490 | 3,510-3,590 |
| B23 | FDD | 2,000-2,020 | 2,180-2,200 |
| B24 | FDD | 1,626.5-1,660.5 | 1,525-1,559 |
| B25 | FDD | 1,850-1,915 | 1,930-1,995 |
| B26 | FDD | 814-849 | 859-894 |
| B27 | FDD | 807-824 | 852-869 |
| B28 | FDD | 703-748 | 758-803 |
| B29 | FDD | N/A | 716-728 |
| B30 | FDD | 2,305-2,315 | 2,350-2,360 |
| B31 | FDD | 452.5-457.5 | 462.5-467.5 |
| B32 | FDD | N/A | 1,452-1,496 |
| B33 | TDD | 1,900-1,920 | 1,900-1,920 |
| B34 | TDD | 2,010-2,025 | 2,010-2,025 |
| B35 | TDD | 1,850-1,910 | 1,850-1,910 |
| B36 | TDD | 1,930-1,990 | 1,930-1,990 |
| B37 | TDD | 1,910-1,930 | 1,910-1,930 |
| B38 | TDD | 2,570-2,620 | 2,570-2,620 |
| B39 | TDD | 1,880-1,920 | 1,880-1,920 |
| B40 | TDD | 2,300-2,400 | 2,300-2,400 |
| B41 | TDD | 2,496-2,690 | 2,496-2,690 |
| B42 | TDD | 3,400-3,600 | 3,400-3,600 |
| B43 | TDD | 3,600-3,800 | 3,600-3,800 |
| B44 | TDD | 703-803 | 703-803 |
| B45 | TDD | 1,447-1,467 | 1,447-1,467 |
| B46 | TDD | 5,150-5,925 | 5,150-5,925 |
| B65 | FDD | 1,920-2,010 | 2,110-2,200 |
| B66 | FDD | 1,710-1,780 | 2,110-2,200 |
| B67 | FDD | N/A | 738-758 |
| B68 | FDD | 698-728 | 753-783 |

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A variable-gain signal amplifier configured to provide a plurality of gain modes, the amplifier comprising:
   a first active core having a multi-input gain stage with a plurality of input nodes, an amplification chain for each input node, a first active core output coupled to the plurality of amplification chains, and gain mode switches configured to selectively couple the multi-input gain stage to a gain mode node;
   a second active core coupled to the gain mode node, the second active core including a single amplification chain and a second active core output; and
   an output node coupled to the first active core output and to the second active core output, the output node configured to receive a signal from the first active core in a first gain mode of the plurality of gain modes and to receive a signal from the second active core in a second gain mode of the plurality of gain modes.

2. The amplifier of claim 1 wherein the gain mode switches decouple the plurality of input nodes from the gain mode node in the first gain mode and couple the plurality of input nodes to the gain mode node in the second gain mode.

3. The amplifier of claim 1 wherein the multi-input gain stage includes a voltage to current gain stage for each input node.

4. The amplifier of claim 3 wherein each amplification chain of the first active core includes an amplification stage coupled to the corresponding voltage to current gain stage.

5. The amplifier of claim 4 wherein the first active core further includes a cascode buffer coupled to the plurality of amplification stages and to the first active core output.

6. The amplifier of claim 1 wherein the amplification chain of the second active core includes an amplification stage coupled to the gain mode node.

7. The amplifier of claim 6 wherein the second active core further includes a cascode buffer coupled to the amplification stage and to the second active core output.

8. The amplifier of claim 1 further comprising an isolation switch coupled to the gain mode switches, the isolation switch including a shunt switch configured to isolate the first active core from the second active core.

9. The amplifier of claim 1 further comprising a bypass block coupled to the gain mode switches, the bypass block configured to provide a path to the output node that bypasses the first active core and the second active core.

10. The amplifier of claim 9 wherein the bypass block further includes a bypass isolation switch to isolate input to the first active core and to the second active core from the bypass block.

11. The amplifier of claim 1 wherein the first active core further includes a first degeneration switching block coupled to the multi-input gain stage and the second active core includes a second degeneration switching block coupled to the single amplification chain.

12. The amplifier of claim 1 wherein the first active core further includes a degeneration switching block for each input node of the multi-input gain stage.

13. The amplifier of claim 1 wherein the first active core is configured to reduce a noise factor relative to the second active core.

14. The amplifier of claim 1 wherein the second active core is configured to improve linearity relative to the first active core.

15. A front-end module comprising:
    a packaging substrate;
    a variable gain signal amplifier implemented on the packaging substrate, the variable gain signal amplifier configured to provide a plurality of gain modes and including a first active core having a multi-input gain stage with a plurality of input nodes, an amplification chain for each input node, a first active core output coupled to the plurality of amplification chains, and gain mode switches configured to selectively couple the multi-input gain stage to a gain mode node; the amplifier further including a second active core coupled to the gain mode node, the second active core including a single amplification chain and a second active core output; and the amplifier further including an output node coupled to the first active core output and to the second active core output, the output node configured to receive a signal from the first active core in a first gain mode of the plurality of gain modes and to receive a signal from the second active core in a second gain mode of the plurality of gain modes.

16. The module of claim 15 wherein the amplifier further includes an isolation switch coupled to the gain mode switches, the isolation switch including a shunt switch configured to isolate the first active core from the second active core.

17. The module of claim 15 wherein the first active core is configured to have a lower noise figure than the second active core and the second active core is configured to have a higher linearity than the first active core.

18. A wireless device comprising:
    an antenna;
    a filter assembly coupled to the antenna to receive signals and to direct frequency bands along select paths; and
    a variable gain signal amplifier configured to provide a plurality of gain modes and including a first active core having a multi-input gain stage with a plurality of input nodes, an amplification chain for each input node, a first active core output coupled to the plurality of amplification chains, and gain mode switches configured to selectively couple the multi-input gain stage to a gain mode node; the amplifier further including a second active core coupled to the gain mode node, the second active core including a single amplification chain and a second active core output; and the amplifier further including an output node coupled to the first active core output and to the second active core output, the output node configured to receive a signal from the first active core in a first gain mode of the plurality of gain modes and to receive a signal from the second active core in a second gain mode of the plurality of gain modes; and a controller implemented to control the variable gain signal amplifier to provide the plurality of gain modes.

19. The wireless device of claim 18 wherein the amplifier further includes an isolation switch coupled to the gain mode switches, the isolation switch including a shunt switch configured to isolate the first active core from the second active core.

20. The wireless device of claim 18 wherein the first active core is configured to have a lower noise figure than the second active core and the second active core is configured to have a higher linearity than the first active core.

\* \* \* \* \*